United States Patent [19]
Kingsley et al.

[11] Patent Number: 5,854,926
[45] Date of Patent: Dec. 29, 1998

[54] METHOD AND APPARATUS FOR IDENTIFYING FLIP-FLOPS IN HDL DESCRIPTIONS OF CIRCUITS WITHOUT SPECIFIC TEMPLATES

[75] Inventors: Christopher H. Kingsley, San Jose; Balmukund K. Sharma, Santa Clara, both of Calif.

[73] Assignee: VLSI Technology, Inc., San Jose, Calif.

[21] Appl. No.: 376,491

[22] Filed: Jan. 23, 1995

[51] Int. Cl.$^6$ .................................................. G06F 9/45
[52] U.S. Cl. .................... 395/705; 395/709; 395/500; 364/488; 364/DIG. 1
[58] Field of Search ............... 395/800, 800.01, 395/705, 709, 520, 500; 364/488, DIG. 1

[56] References Cited

U.S. PATENT DOCUMENTS

| | | | |
|---|---|---|---|
| 5,530,843 | 6/1996 | Koyama | 395/500 |
| 5,581,781 | 12/1996 | Gregory | 364/488 |

OTHER PUBLICATIONS

R. K. Brayton, et al., "MIS: A Multiple–Level Logic Optimization System," *IEEE Trans. on Computer–Aided Design*, vol. CAD–6, No. 6, pp. 1062–1081, Nov. 1987.

K. A. Bartlett, et al., "Multilevel Logic Minimization Using Implicit Don't Cares," *IEEE Trans. on Computer–Aided Design*, vol. 7, No. 6, pp. 723–740, Jun. 1988.

J. A. Darringer, et al., "Logic Synthesis Through Local Transformations," *IBM J. Res. Develop.*, vol. 25, No. 4, pp. 272–280, Jul. 1981.

S. Devadas, et al., "Boolean Decomposition in Multi–Level Logic Optimization," *Proceedings of the IEEE International Conference on Computer–Aided Design*, pp. 290–293, 1988.

K. Keutzer, "DRAGON: Technology Binding and Local Optimization by DAG Matching," *Proceedings of the 24th ACM/IEEE Design Automation Conference*, pp. 341–347, 1987.

H. Savoj, et al., "Fast Two–Level Logic Minimizers for Multi–Level Logic Synthesis," *Proceedings of the IEEE International Conference on Computer–Aided Design, Digest of Technical Papers*, pp. 544–547, 1989.

*ASIC Synthesizer for Verilog Design*, Compass Design Automation, Version V8R4.0, Nov. 1992.

M. A. Breuer, *Design Automation of Digital Systems, vol. one, Theory and Techniques*, Prentice–Hall, Inc., 1972.

R. K. Brayton, *Logic Minimization Algorithms for VLSI Synthesis*, Kluwer Academic Publishers, 1984.

*Primary Examiner*—Alyssa H. Bowler
*Assistant Examiner*—John Follangbee
*Attorney, Agent, or Firm*—Irell & Manella LLP

[57] ABSTRACT

A method and apparatus is disclosed for detecting edge-sensitive behavior from HDL descriptions of a circuit and inferring a hardware implementation of that behavior as a generalized edge-triggered D-type flip-flop with asynchronous set and clear inputs. The invention detects the edge-sensitive behavior from directed acyclic graphs (DAGS) that represent the individual signal nets of the circuit as affected by each process defined in the HDL description of the circuit. The invention then modifies each DAG to infer the asychronous control expressions and the data input expression necessary to control generalized flip-flop to emulate the behavior of the net represented by the DAG. The invention then creates a symbolic hardware implementation of the net's behavior using the D-type flip-flop and any combinational logic necessary to produced the inferred control signals. The symbolic hardware implementations for each net can then be optimized using well-known techniques, and a netlist generated therefrom for purposes of creating masks for manufacturing the circuit. The invention can be easily implemented within known symbolic simulator routines already capable of synthesizing level-sensitive behavior using combinational logic.

19 Claims, 21 Drawing Sheets

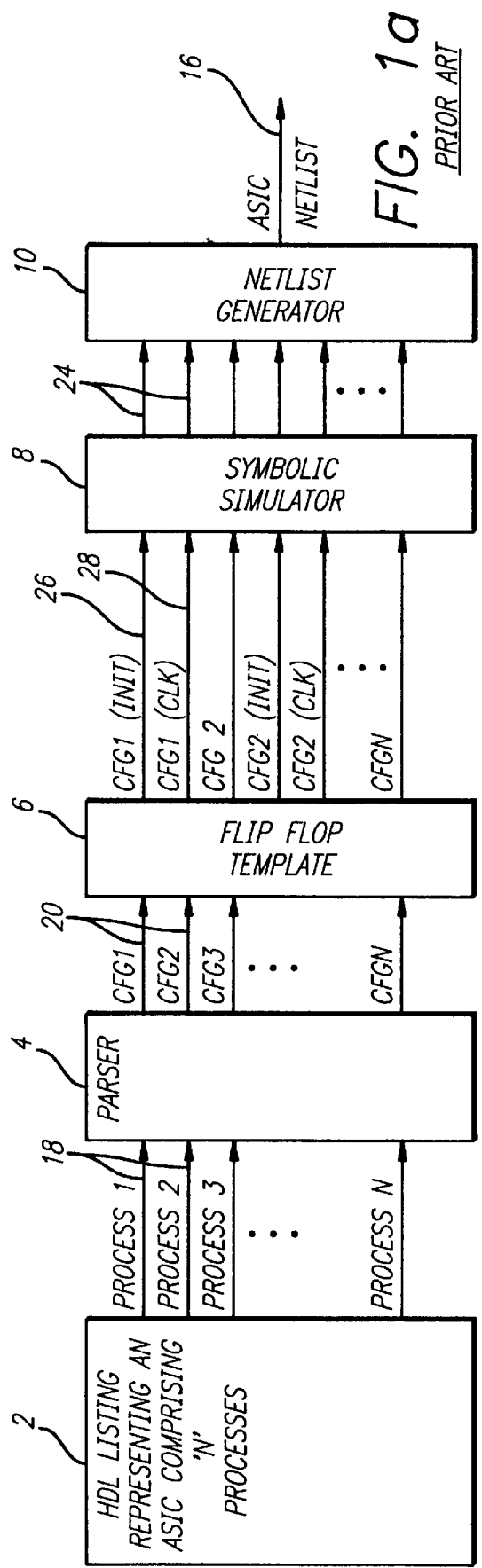
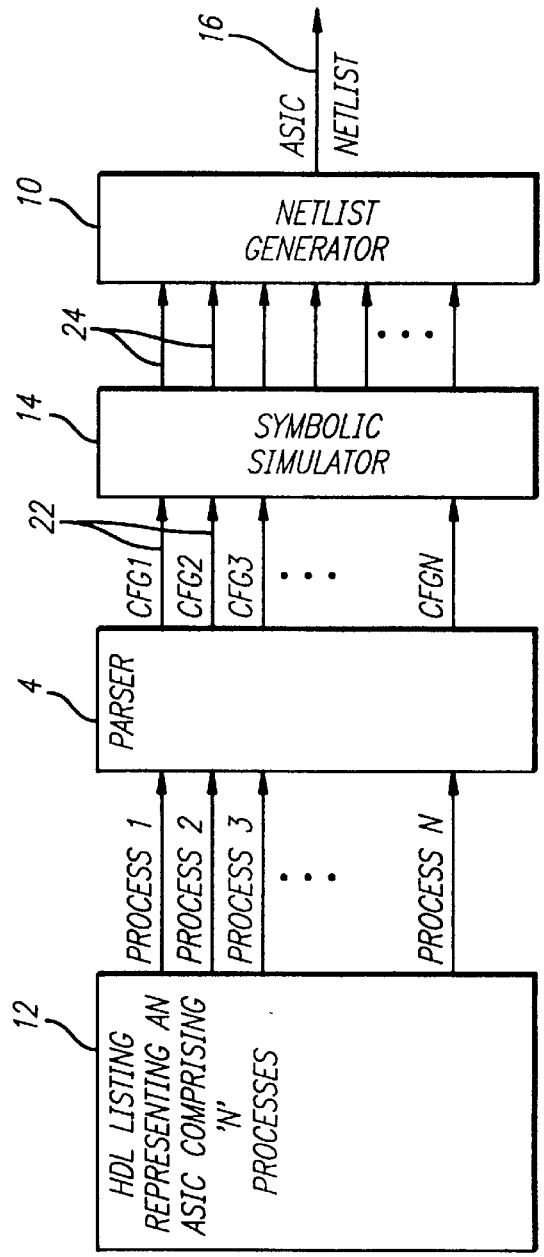
FIG. 1a PRIOR ART
FIG. 1b

FIG. 2a

```
P1: PROCESS (clk, reset)
begin
    if reset = '0' then
      q<=0;
    elsif clk 'event and clk = '1' then
        g<=d;
    end if;
end process;
```

FIG. 2b

```
P2: PROCESS (clk, reset)
begin
    if clk 'event and clk = '1' then
      q<=d;
    end if;
    if reset  '0' then
      q<=0;
    end if;
end process;
```

EXPRESSION GRAPH ($P_1$)

ASYNCHRONOUS CONTROL EXPRESSION ($P_1$ AND $P_2$)

SEPARATED SET AND CLEAR EXPRESSIONS ($P_1$ AND $P_2$)

SET N                                    CLEAR N

```
P₃: PROCESS (clk, reset, A, B)
begin
    x<=A X OR B         ⎬─50
    if reset = '0' then
        q<=0;
    elsif ↑clk then
        q<=d;
    end if;
end process;
```

```
P₅: PROCESS ( mode, rst1, rst2, rst3, clk)
begin
    if mode = '1' then
        if rst1 = '1' then
            if rst 3 = '1'
                q<=3;
            end if;
        elsif ↑ clk then
            q<=d1;
        endif;
    elsif rst 2 then
        q<=6;
    elsif ↑ clk then
        q<=d2;
    endif;
    endif;
end process;
```

EXPRESSION GRAPH - P₅

FIG. 6a
P$_4$: PROCESS (CLK, ldt.., ldata)
begin
    if ld En = '1' then
        q<=ldata;
    elsif clk 'event and clk = '1' then
        q<=d;
    end if;
end process;
FIG. 6b
EXPRESSION GRAPH (P$_4$)
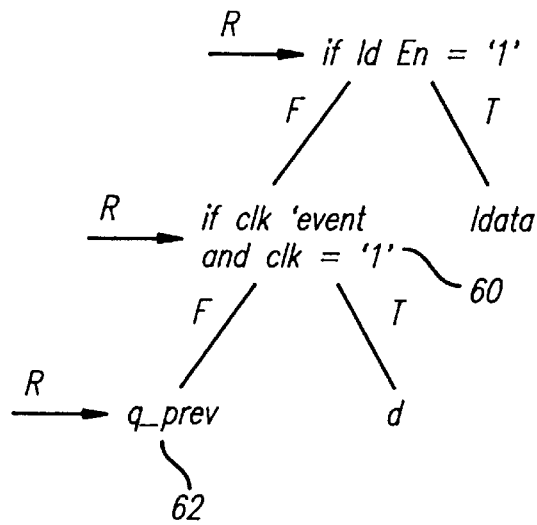
FIG. 6c
ASYNCH. CONTROL EXPRESSION (P$_4$)
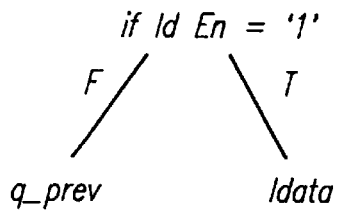

SEPARATED SET AND CLEAR EXPRESSIONS (P₄)
FIG. 6d
SET N
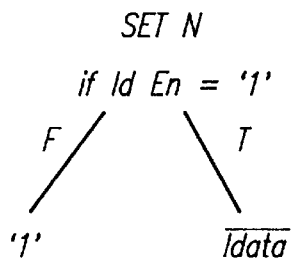
CLEAR N
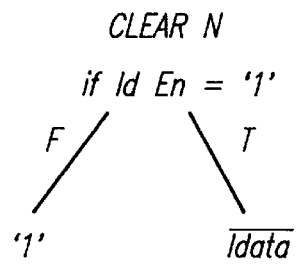
FIG. 6e
DATA INPUT EXPRESSION (P₄)
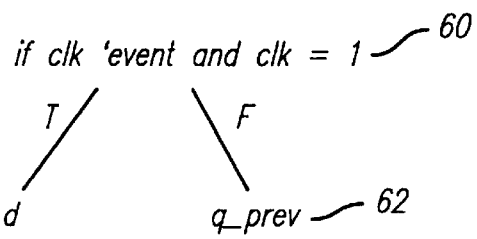
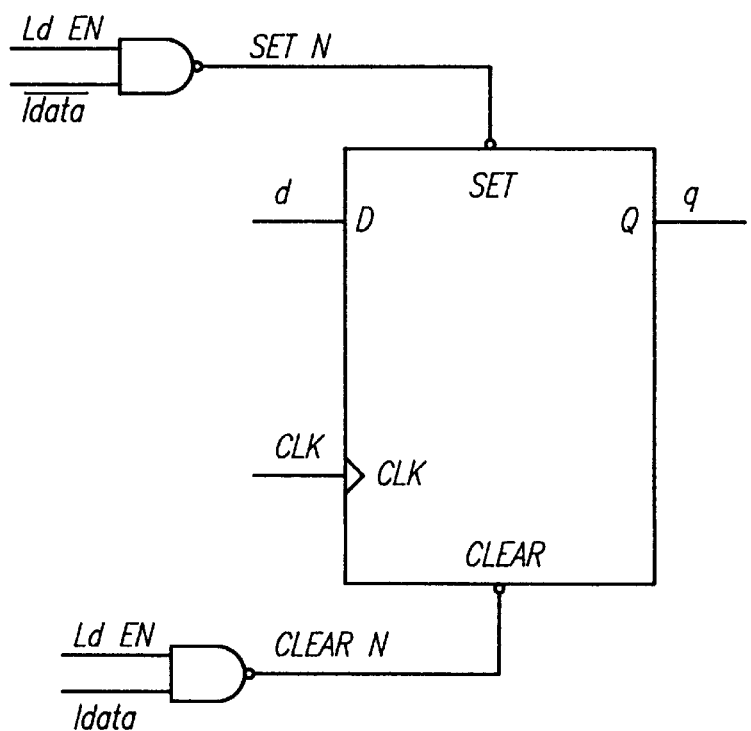
FIG. 6f
HARDWARE IMPLEMENTATION INFERRED FROM EXPRESSION GRAPH (P₄)

ASYNCHRONOUS CONTROL EXPRESSION – $P_5$

SEPARATED SET AND CLEAR EXPRESSION ($P_5$)

DATA INPUT EXPRESSION ($P_5$)
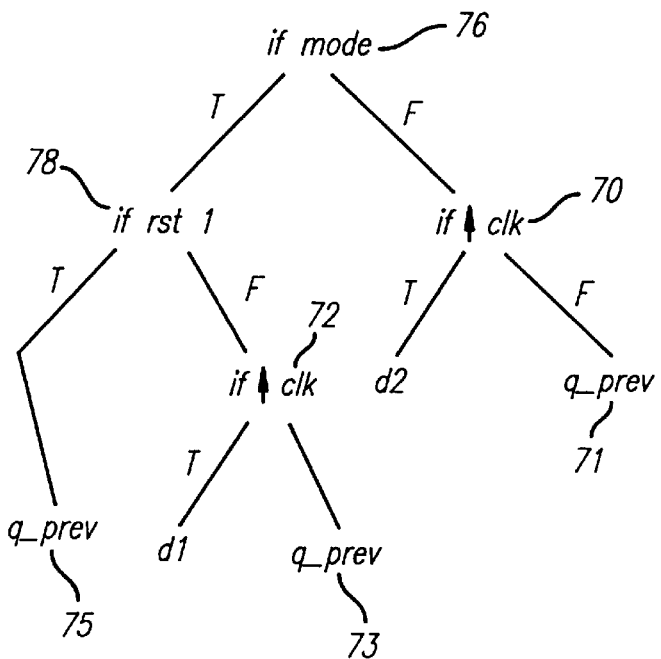
FIG. 7e
FIG. 7f
EVACUATE INPUT EXPRESSION ($P_5$)
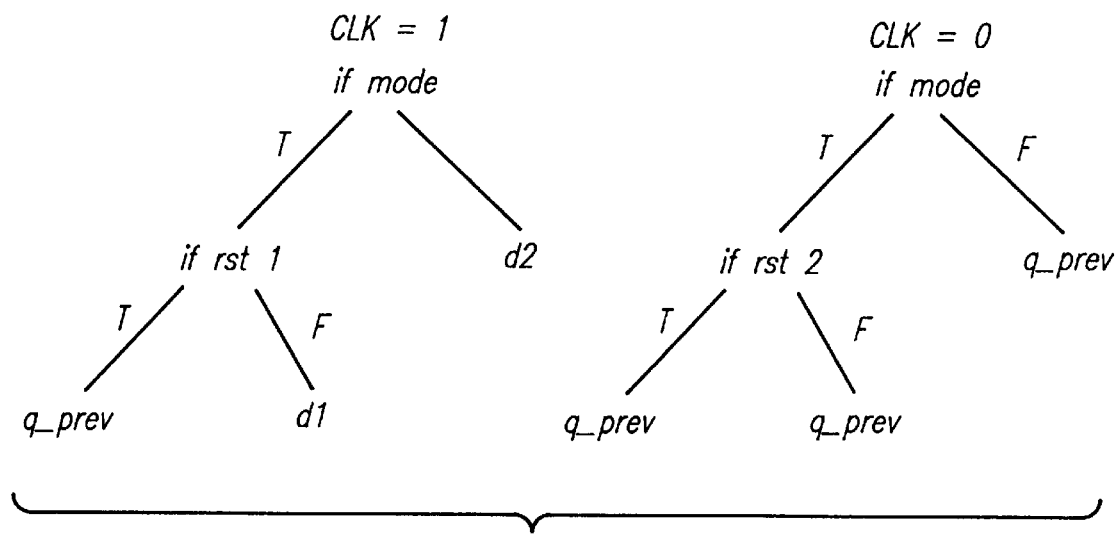

FIG. 8a
$P_6$: PROCESS (CLK)
begin
    if ld En = '1' then
        q<=D
    end if;
end process
FIG. 8b
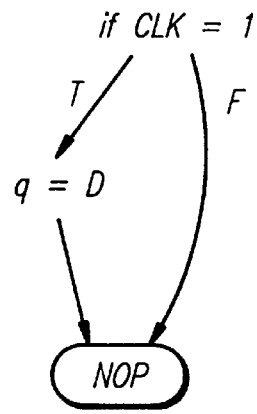
FIG. 8c
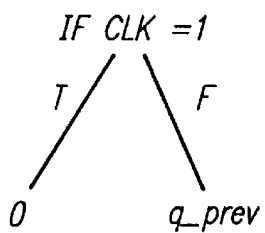
FIG. 8d
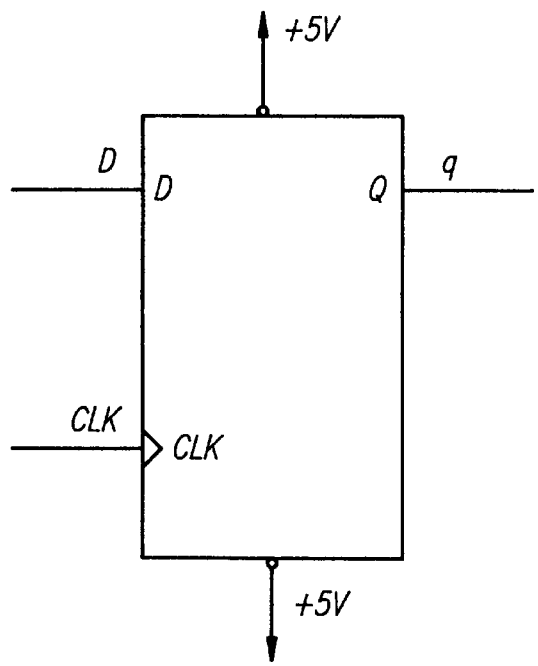
FIG. 8e
$P_7$: PROCESS (clk)
begin
    if CLK = '1' then
        q<=$D_1$;
    else
        q<=$D_2$;
    end if;
end process;

FIG. 9a
```
P_8: PROCESS (CLK1, CLK2)
begin
    if CLK1 'event and CLK1 = '1' then
        dbus (7 down to 4) <= d_1;
    end if;
    if CLK1 'event and CLK2 = '1' then
        dbus (3 down to 0) <= d2;
    end if;
end process;
```
FIG. 9b
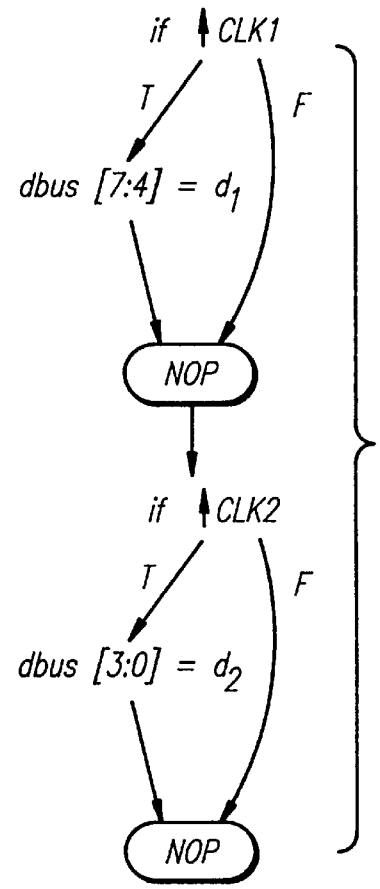
FIG. 9c
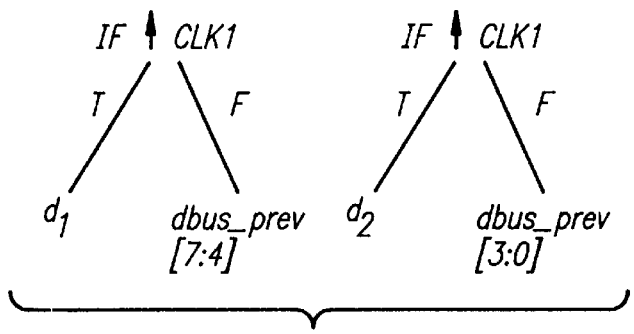
FIG. 9d
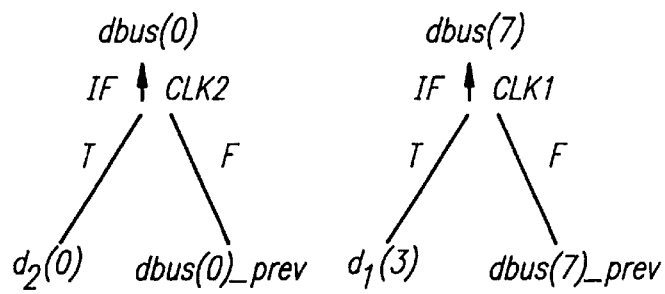

```
P9: PROCESS (CLK)
begin
    if CLK 'event then
        if CLK = '1' then
            dbus (7 down to 4) <= d1;
        else
            dbus (3 down to 0) <= d2;
        end if;
    end if;
end process;
```

```
P10: PROCESS (CLK)
begin
    if CLK = '1' then
        dbus (7 down to 4) < = d1;
    else
        dbus (3 down to 0) < = d2;
    end if;
end process;
```

METHOD AND APPARATUS FOR IDENTIFYING FLIP-FLOPS IN HDL DESCRIPTIONS OF CIRCUITS WITHOUT SPECIFIC TEMPLATES

BACKGROUND OF THE INVENTION

1. Field of the Invention

The invention relates to the automated synthesis of custom integrated circuits (ASICS) from functional language descriptions of the circuit, and more particularly to the identification of edge-sensitive behavior and inference of flip-flop implementations of that behavior from the functional language descriptions.

2. Background of the Related Art

The huge capital expenditure necessary to establish and operate a semiconductor manufacturing plant has rendered it cost ineffective for small systems design companies to attempt to manufacture their own integrated circuits. These conditions have spawned an industry whereby semiconductor manufacturers have offered to fabricate customized integrated circuits for such small companies. Because these customers require a short design cycle, and because the expected sales volume of such circuits is relatively small compared to the manufacturer's standard products, a bottom-up design approach is not cost effective.

Thus, synthesis tools have been developed which permit the system designer to specify and verify the operation of the desired circuit on a functional level. One such standard functional language is known as the VHSIC Hardware Description Language or VHDL. The synthesizer is able to, through a series of stages, infer from the functional description the Boolean expressions which define the functions in a manner which can be translated into logic cells which are stored in a library. The Boolean expressions are transformed into a netlist which defines the necessary hardware components and their requisite connectivity. From the netlist, masks can be generated for manufacturing the circuit. This is known as a top-down design approach.

It is well-known by those of skill in the synthesis tool art how to synthesize netlists from HDL representations of circuits which involve simple combinational logic. For an introduction to the synthesis of a Boolean network from the behavioral description of a circuit in HDL, reference is made to a paper by Brayton, R., R. Rudell, et al., "MIS: Multiple-Level Interactive Logic Optimization System," IEEE Transactions on Computer-Aided Design of Integrated Circuits and Systems CAD 6(6__): 1062–1081 (1987), the entire text and figures of which are incorporated herein by this reference.

Additional references for purposes of background are as follows: Bartlett, K. A., W. Cohen, et al., "Synthesis and Optimization of Multilevel Logic Under Timing Constraints," IEEE Transactions on Computer-Aided Design of Integrated Circuits and Systems, CAD 7(6):723–740 (1988); Brayton, R. K., G. D. Hachtel, et al., *Logic Minimization Algorithms for VLSI Synthesis* Boston Mass., Kluwer Academic Publishers (1984); Breuer, M. A., *Design Automation of Digital Systems Theory and Techniques* Prentice-Hall 1972; Darringer, J., W. Joyner, et al., "Logic Synthesis Through Local Transformations," IBM Journal of Research and Development 4:272–280 (1981); Devadas, S., A. Wang, et al., "Boolean Decomposition in Multi-Level Logic Optimization, Proceedings of the IEEE International Conference on Computer-Aided Design, 1988; Keutzer, K., "Dagon: Technology Binding and Local Optimization by DAG Matching," Proceedings of the 24th Design Automation Conference, 1987; Savoj, J., A. A. Malik, et al., "Fast Two-Level Minimizers for Multilevel Logic Synthesis," Proceedings of the IEEE International Conference on Computer Aided Design, 1989; the entire text and figures of which are incorporated herein by this reference.

Such custom circuits, however, also typically involve edge-sensitive behavior which requires the use of flip-flops. Inferring flip-flop hardware implementations of such behavior from the functional description of the circuit presents difficulties because such behavior is typically event-driven (i.e. the circuit net changes state is based on a clock edge), but can be asynchronously initialized by a clear and/or set input. Further, there are virtually unlimited ways in which such behavior may be functionally described.

One prior art approach used to identify flip-flops from the functional description of the circuit is by the application of templates which when matched cause the synthesizer to recognize the existence of the particular flip-flop specified by the particular template which is matched. Some approaches apply a template to match the actual HDL code used to specify the flip-flop process. Another approach applies the template to control flow graphs (CFGs) generated to represent the control flow of the HDL processes. A system employing such a flip-flop template is illustrated in FIG. 1a.

An ASIC circuit is first represented as listing 2 in an HDL functional language such as VHDL. The ASIC as represented by the HDL listing 2 has been simulated and verified by executing the HDL representation. The functional representation of a circuit in HDL is written as a series of 'N' processes. Each of the N processes is then converted into a corresponding control flow graph (CFG) 20 by parser 4. The CFG represents the control conditions and variable operations of the process. To recognize and infer flip-flops in any of the N processes of the ASIC, a flip-flop template 6 is applied to the CFG's 20. The template 6 looks for a very specific CFG flow structure to identify a particular flip-flop within a process. If any of the templates is not precisely matched, no flip-flop can be inferred for the procedure, even though the functional behavior is edge-sensitive and must be so implemented.

Edge-sensitive behavior is primarily characterized by the existence of an 'EVENT operator within the process, which signifies an operation on an input signal initiated on a rising or falling clock edge. If such a structure is precisely matched by one of the templates 6, it fragmentizes the CFG into an initialization fragment 5 (that portion of the CFG which represents the asynchronous set and/or clear behavior of the process) and a clock fragment 7 (i.e. that portion of the CFG that describes the clocked behavior of the process and from which the input expression to the flip-flop is ultimately derived).

The CFGs and CFG fragments for the N processes are then processed by symbolic simulator 8, which generates flattened (i.e. acyclic) expression graphs for each signal affected by each process. From these expression graphs or directed acyclic graphs (DAGs), Boolean expressions (i.e. combinational logic equations) are derived which can be translated into a netlist. The netlist specifies those circuit components contained within a cell library capable of implementing the process behavior, as well as the connectivity required among the specified components to satisfy the Boolean expressions and ultimately to emulate the functional behavior specified by the original HDL listing. An example of such a prior art synthesizer is commercially available from Compass Design Automation, Inc. of San Jose, Calif. The product is called the Compass ASIC Synthesizer, Version V8R4.6.3.

There are a number of problems with the use of templates to identify edge-sensitive behavior in a process and to infer the flip-flop implementation of that behavior from the hardware description language. First, there are many ways in which even the behavior of one particular flip-flop may be described using an HDL. Thus, even if a large portion of the possible templates could be provided, there would still be no way to completely cover the most general cases. This constrains the manner in which users can semantically specify edge-sensitive behavior in their functional descriptions so that the hardware implementation of such behavior can be automatically inferred as particular flip-flops. Such constraints on users are highly undesirable.

FIGS. 2a and 2b illustrate two ways in which the edge-sensitive behavior, implementable as an edge-triggered D-type flip-flop with asynchronous set and clear, can be specified semantically as an HDL process. FIGS. 3a and 3b illustrate the conversion of the two processes of FIGS. 2a and 2b respectively into control flow graphs (CFGs). Using the prior art method, the user would likely be restricted to using either one or the other. Otherwise two different templates would have to be provided to identify the same edge-sensitive behavior and to infer the same flip-flop implementation.

Process $P_3$ of FIG. 5 illustrates how easily process $P_1$ can be rendered undetectable by the prior art template process. Because the template must fragment the CFG of the process into a fragment which is controlled by the initialization signals and a second fragment which defines the clocked behavior of the circuit, the template process must assume for simplicity that all output signals affected by the process are controlled by the same initialization and/or clock inputs. There are an infinite number of possible expressions that a user may wish to include in a process, such as the expression 50 for the variable X, which is independent of the edge-sensitive behavior of the process. If the user is not constrained from including such expressions, an infinite number of templates would have to be provided to infer the flip-flop implementation of the edge-sensitive behavior described within such a process.

For this reason, the prior art template solution cannot easily handle a situation where the edge-sensitive behavior of a process would require a hardware implementation of two or more flip-flops which are not clocked by the same clock signal and/or not initialized by the same asynchronous initialization signals. For every additional flip-flop, another infinite set of templates must be provided. Further, the template solution cannot easily handle the situation where the behavior of a process requires an implementation where even the same flip-flop is driven by two different clock events (i.e. two ticks) on the same clock signal. Again, for each additional clock event, a new set of templates must be provided.

There is therefore a need in the art of synthesis for a method of automatically extracting flip-flop hardware implementations from HDL representations of processes involving edge-sensitive behavior which does not require semantical restrictions to be placed on users and which can identify edge-sensitive behavior and infer the requisite flip-flop hardware implementations of such behavior in the most general of cases.

SUMMARY OF THE INVENTION

The present invention is a method and apparatus for inferring the symbolic hardware representation of edge-sensitive circuit behavior from a functional description of a circuit. It is well-known how to infer the symbolic hardware representation of level sensitive circuit behavior as combinational logic. When inferring a hardware implementation of edge-sensitive behavior, however, prior art solutions such as semantic templates have proven to be overly narrow in the types of edge-sensitive behavior that could be recognized. Further, templates constrain users to very rigid semantical rules in describing edge-sensitive behavior in their functional circuit descriptions.

The present invention is superior to prior art solutions such as templates because it does not constrain users to any particular mode of expression, it permits the inference of hardware implementations for the most general cases of edge-sensitive behavior and it works within the same context as that already developed for inferring combinational logic implementations of level-sensitive behavior.

The process of developing an integrated circuit with a top-down approach in accordance with the present invention first involves the step of specifying the desired behavior of the circuit, describing the circuit's behavior functionally and verifying the functionality through simulation. This step is accomplished using well-known hardware description languages such as VHDL.

Control flow graphs (CFGs) are then generated for each functional process described in the HDL description of the circuit. This step is accomplished using well-known parsing techniques.

Control loops and other cyclical features of the CFGs are then flattened into directed acyclic graphs (DAGs) which are built to represent the value of each signal net affected by the execution of each process. Again, building DAGs to represent the value of each signal (i.e. net) affected by the execution of a process (depending upon the existence of specified conditions), is accomplished using well-known symbolic simulation techniques.

The present invention then extracts symbolic hardware implementations of the behavior of each of the nets comprising each of the processes. If the behavior of a net is merely level-sensitive, the hardware implementation of that behavior is simply combinational logic. Any edge-sensitive behavior of a net is implemented as an edge-triggered D-type flip-flop, along with any necessary combinational logic for controlling the flop-flop's asynchronous inputs (i.e. set and/or clear) and data input (i.e. D). The clock input to the flip-flop is driven by the appropriate edge (i.e. rising or falling edge) of the net's clocked input signal.

If any behavior that is specified for a net is not implementable as combinational logic or as an edge-triggered D-type flip-flop, an error condition is flagged for that net and a netlist for the circuit is not generated until any errors have been corrected. When no errors remain, the symbolic hardware representations of all of the nets can be optimized using well-known techniques for optimizing hardware. A netlist is then generated which specifies standard cell components and the connectivity between them to realize the inferred hardware representation of the circuit. From the netlist, masks can be generated for manufacturing the integrated circuit.

The step of extracting the symbolic hardware implementation of each net of each process further involves the step of determining from the DAG representing each net whether the net involves an edge-triggered behavior. If the current net does not reflect edge-triggered behavior, it is implemented as combinational logic. If it does not involve edge-triggered behavior, and it is sensitive to only one distinct clocked input signal, the invention first extracts from the DAG representing the current net the expressions governing the asynchronous control inputs of the edge-triggered D-type flip-flop (i.e. set and clear).

The method of the invention then extracts from the DAG representing the current net the expression defining the data input to the flip-flop (i.e. the 'D' input) as well as to which edge of the clock signal the flip-flop should be sensitive. Finally, the net is implemented using the edge-triggered D-type flip-flop, including the combinational logic which implements the asynchronous control expressions and the data input expression.

The step of extracting the asynchronous input expressions from the DAG representing the current net further includes the steps of: rebuilding the DAG with all 'EVENT conditions set equal to FALSE; determining separate expressions for an active low set (i.e. setN) and an active low clear (i.e. clearN) inputs to the flip-flop; and evaluating the separate setN and clearN expressions for each leaf to extract the logical expressions defining each control input.

The step of extracting the data input expression from the DAG representing the current net further includes the steps of: rebuilding the DAG by trimming any paths which are dependent on asynchronous control inputs; replacing all 'EVENT conditions with TRUE; evaluating the rebuilt DAG with the clock signal equal to a binary one, then with clock equal to a binary zero; and extracting the logical expression for the data input from the DAG when the clock value set does not result in a value for the net which was its value prior to execution of the process.

The step of extracting the data input expression can further include the step of detecting when neither value of the clock input produces a value for the net which was its value prior to execution of the process. If so detected, the invention checks to see if the net is a concatenate. If it is, the concatenate is broken up into nets for each single-bit individual bit of the concatenate. New DAGs are generated for each single-bit net and the method processes each single-bit net as previously discussed. If the invention determines that the net is not a concatenate, an error is flagged for the net and no netlist will be generated after all nets have been processed.

The step of determining whether the current net involves edge-triggered behavior may further include the step of detecting implicitly specified edge-triggered behavior. The step of determining may also include the step of detecting behavior which is sensitive to more than one distinct clock input signal. If so detected, the invention checks to see whether the net is a concatenate. If it is a concatenate, the concatenate is broken up as previously discussed. If not a concatenate, an error is flagged for the net and netlist generation is suppressed.

BRIEF DESCRIPTION OF THE DRAWINGS

FIG. 1a is a procedural flow diagram illustrating the process of synthesizing ASIC circuits using prior art synthesis techniques.

FIG. 1b illustrates a procedural flow diagram for synthesizing ASIC circuits using the method of the present invention.

FIG. 1f is a process flow diagram describing the procedure for extracting asynchronous expressions from a DAG representing the current net.

FIG. 1g-2 is a continuation of the process flow diagram of FIG. 1g-1.

FIG. 2a illustrates an HDL description of a process $P_1$ involving particular edge-sensitive behavior.

FIG. 2b illustrates an HDL representation of a process $P_2$ which has a different description for the same edge-sensitive behavior as involved in $P_1$.

FIG. 3a is a control flow graph (CFG) for process $P_1$ of FIG. 2a.

FIG. 4a illustrates an expression graph or DAG representing the only net of process $P_1$ of FIGS. 2a and 3a.

FIG. 6a is an HDL description of a process $P_4$ which involves asynchronous load behavior.

FIG. 6b is the expression DAG representing the only net of process $P_4$.

FIG. 6c illustrates the asynchronous control expression of the process $P_4$.

FIG. 6d illustrates the separated setN and clearN expressions for the process $P_4$.

FIG. 6e illustrates the data input expression for the process $P_4$.

FIG. 6f illustrates a hardware implementation of the behavior of process $P_4$.

FIG. 7e illustrates the data input expression of $P_5$.

FIG. 7f illustrates the evaluation of the input expression of FIG. 7e for CLK=1 and CLK=0.

FIG. 8a illustrates an HDL description of a process $P_6$ which describes implicit edge-triggered behavior.

FIG. 8b illustrates the CFG for the process $P_6$.

FIG. 8c illustrates the expression DAG representing the only net in the process $P_6$.

FIG. 8d illustrates the symbolic hardware implementation of the edge-sensitive behavior described by $P_6$.

FIG. 8e illustrates an HDL description of a process $P_7$ for which edge-sensitive behavior will not be inferred.

FIG. 9a illustrates an HDL description of a process $P_8$ which involves the concatenation of output bits as a bus and wherein one portion of the bits comprising the bus are clocked by one clock, and a second portion of the bits being sensitive to a second clock.

FIG. 9b is a CFG for the process $P_8$ of FIG. 9a.

FIG. 9c is an expression DAG for the process $P_8$.

FIG. 9d illustrates individual expression DAGs for the least significant bit of the bus output as well as the most significant bit of the bus output.

NOTATION AND NOMENCLATURE

The detailed descriptions which follow are presented largely in terms of procedures and symbolic representations of operations on data bits within a computer memory. These descriptions and representations are the means used by those skilled in the data processing arts to most effectively convey the substance of their work to others skilled in the art.

A procedure or method is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar digital devices. In all cases there should be borne in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The procedures presented herein are not inherently related to a particular computer or other apparatus. In particular, various general purpose machines may be used with programs written in accordance with the teachings herein, or it may prove more convenient to construct more specialized apparatus to perform the required method steps. The required structure for a variety of these machines will appear from the description given below.

DETAILED DESCRIPTION OF THE INVENTION

Figure 1C:
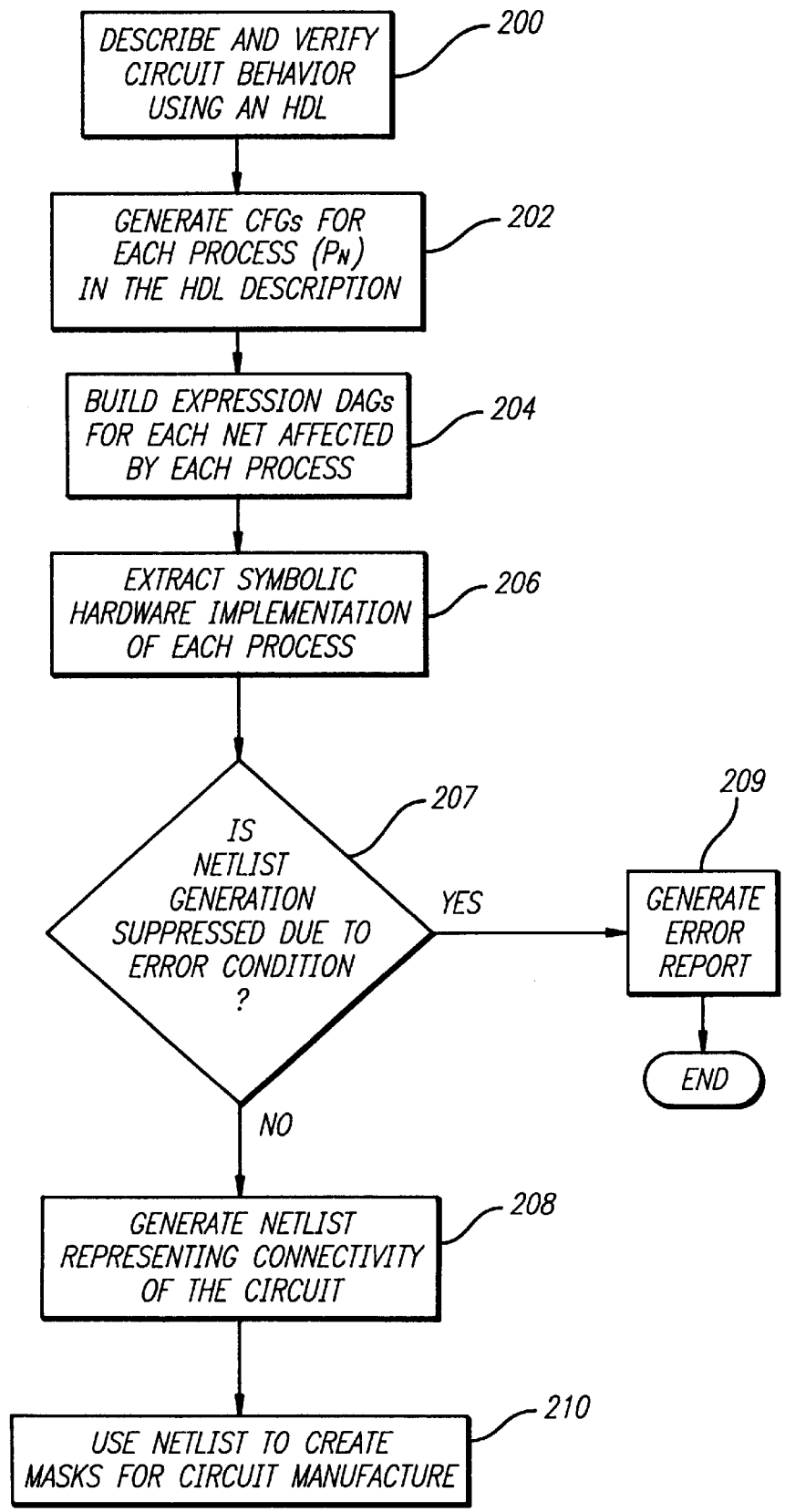
FIG. 1c is a top-level process flow diagram describing ASIC synthesis using the method of the present invention.

As previously discussed, the first step in a top-down ASIC circuit design is to specify the desired behavior of the circuit and to describe the desired behavior in a hardware description language such as VHDL. The HDL description is then executed to verify that the description accurately defines the behavior desired. Block 200 of FIG. 1c represents this step and Blocks 2 and 12 of FIGS. 1a and 1b represent the actual HDL behavioral description.

The next step in synthesizing an ASIC circuit (Block 202, FIG. 1c) from a behavioral description such as HDL is to convert each of the N processes of the HDL representation into N CFGs. The CFGN provides a procedural description of the process $P_N$. The nodes of the $CFG_N$ typically represent statements from the HDL description of the process $P_N$ and arcs between the nodes represent transfer of control between the statements. Statements such as those which assign values to variables have only one arc to the following statement. Nodes representing IF or CASE statements will have arcs to more than one statement (node) following it. Special nodes (e.g. NOP) are included to indicate where control flow paths merge. Those of skill in the art will recognize that converting HDL process descriptions to CFGs is well-known. A parser 4 (FIGS. 1a and 1b) is typically used to generate the N CFGs.

Figure 3A:
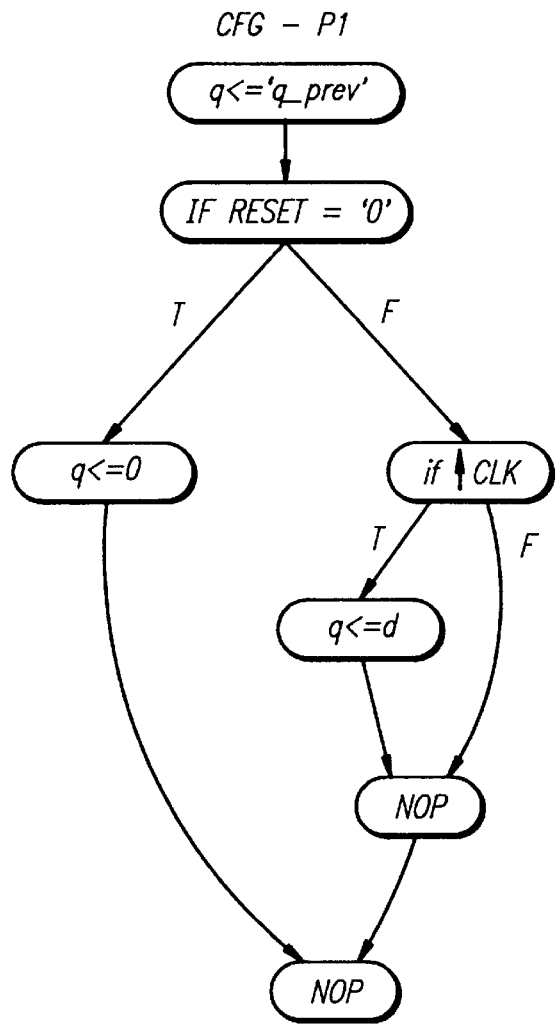
Figure 3B:
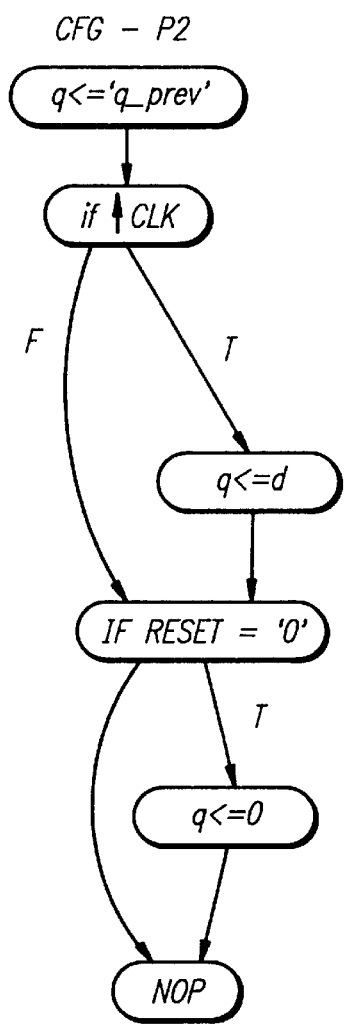
FIG. 3b is a CFG for process $P_2$ of FIG. 2b.

Processes and their respective CFGs can include operators such as 'EVENT, which indicate that an operation will occur on the rising or falling edge of a clock-type input. FIGS. 3a and 3b illustrate CFGs for the HDL processes of FIGS. 2a and 2b respectively. Each of the processes, and thus their respective CFGS, contain 'EVENT operators indicating that the operation is true for a rising edge of the input signal 'clk'. The input clk is therefore a clocked input.

In the prior art synthesizer of FIG. 1a, the flip-flop templates 6 are applied to the CFGs 20, first to identify the existence of legal uses of 'EVENT (i.e. those uses which match a particular template's use), and then to partition or fragment those CFGs matching particular templates in accordance with the template matched. The synthesizer splits each matched CFG into a CFG fragment describing the procedural flow of the process' asynchronous initialization behavior (i.e. CFG(INIT) 26) and a CFG fragment describing the procedural flow of its clocked behavior (i.e. CFG(clk) 28). This fragmentation process is performed in a preset manner based on the particular template 6 which is matched to the CFG. Each template also specifies the active level of the initialization and clock signals.

The symbolic simulator 8 then executes the procedure described by each CFG and CFG fragment to extract combinational logic equations 24 defining the behavior of each signal net affected by the execution of each of the N processes. The symbolic simulator builds expression graphs (i.e. directed acyclic graphs) for each signal or net affected by one of the N processes. The expression graphs define the output signals or nets of each process in terms of the process input signals independent of control flow (i.e. they define the values of each signal net after having had the control flow of their respective CFG's unrolled or fattened into expressions).

For purposes of flip-flop implementation, the CFG(INIT) yields the logic equation 24 defining the controlling function for asynchronous initialization of the flip-flop, and the CFG(Clk) yields the logic equation 24 defining the controlling function for the input(s) to the flip-flop. Those of skill in the art will recognize that it is well-known to use a symbolic simulator to derive logic expressions 24 defining the combinational logic required to emulate the behavior described by the CFGs and CFG fragments that are its inputs.

Finally, a Netlist Generator 10 procedure is applied which converts the Boolean or combinational logic expressions, along with the identified flip-flops, into a netlist representation of the circuit that specifies component type and connectivity between the specified components. Those of skill in the art will recognize that it is well-known how to convert Boolean expressions into a netlist and how to use a netlist in conjunction with a standard cell library to generate masks for purposes of manufacturing the ASIC.

The method of the present invention is illustrated in FIGS. 1b through 1g-2. As can be seen from FIG. 1c, the steps of the present invention represented by Blocks 200, 202, 208 and 210 are common to the prior art methods previously discussed. Rather than apply templates 6 to the CFGs, however, the present invention detects edge-sensitive behavior and infers the requisite flip-flop hardware implementation of that behavior directly from the DAGs generated by the symbolic simulator 14 of FIG. 1b. Thus, processes $P_N$ of the HDL description 12 (FIG. 1b), upon which there are no constraints placed due to the use of templates, are converted to CFGs 22 by parser 4. Each $CFG_N$ is then converted to one or more DAGs by symbolic simulator 14. A separate DAG is generated for each net affected by execution of the process $P_N$. These steps are also illustrated in FIG. 1c by Blocks 200, 202, and 204.

As the DAGs are built through symbolic simulation, they are analyzed in accordance with the method of the present invention to infer any edge-sensitive behavior implementable in hardware as flip-flops, regardless of how that behavior was semantically described in the HDL representation of the circuit. Thus, the heart of the invention resides in the routines represented by Block 206 of FIG. 1c. The method of detecting edge-sensitive behavior and extracting the hardware flip-flop implementation of that behavior from the DAGs representing the nets affected by the execution of the processes $P_N$ is now described in conjunction with FIGS. 1d through 1g-2.

Each of the directed acyclic graphs (DAGs) is examined to determine whether the net it represents (i.e. the current net) is sensitive to a clock edge (i.e. whether it exhibits edge-sensitive behavior). This step is signified by Block 214 of FIG. 1d. Edge-sensitive behavior is most typically manifested as an 'EVENT operator. If no 'EVENT operator is found, then except for a few exceptions that will be discussed later, the DAG does not represent edge-sensitive behavior and thus requires no further processing insofar as flip-flop extraction is concerned. The current net is then implemented as combinational logic as illustrated by Block 222 of FIG. 1d. The method then proceeds to either the DAG representing the next net affected by the execution of the current process $P_N$, or to the next process $P_{N+1}$ if there are no additional DAGs representing nets affected by the current process $P_N$ (Blocks 215 and 211, FIG. 1d).

If edge-sensitive behavior is detected at Block 214 within the current DAG, the DAG is then processed at Block 216 to extract the asynchronous control expressions for the current net. These expressions, if any, will define the logic controlling the setN and clearN inputs ("N" indicates that the inputs are active low) of a D-type flip-flop that will be used (at least initially) to represent the hardware implementation of the behavior of the current net. Processing then continues at Block 218, during which the input expression for the current net is determined. This expression defines the logic controlling the D input of the D-type flip-flop that will be used (at least initially) to represent the hardware implementation of the behavior of the current net.

Finally, at Block 220 the behavior of the current net is implemented as a D-type flip-flop with edge trigger, along with standard combinational logic gates for producing the appropriate control and data inputs from the asynchronous and data input expressions. Those of skill in the art will recognize that the benefit of inferring all flip-flop behavior initially as an edge-triggered D-type flip-flop is a standardized process. Any flip-flop behavior can be implemented as D-type with some additional logic circuitry.

Figure 1D:
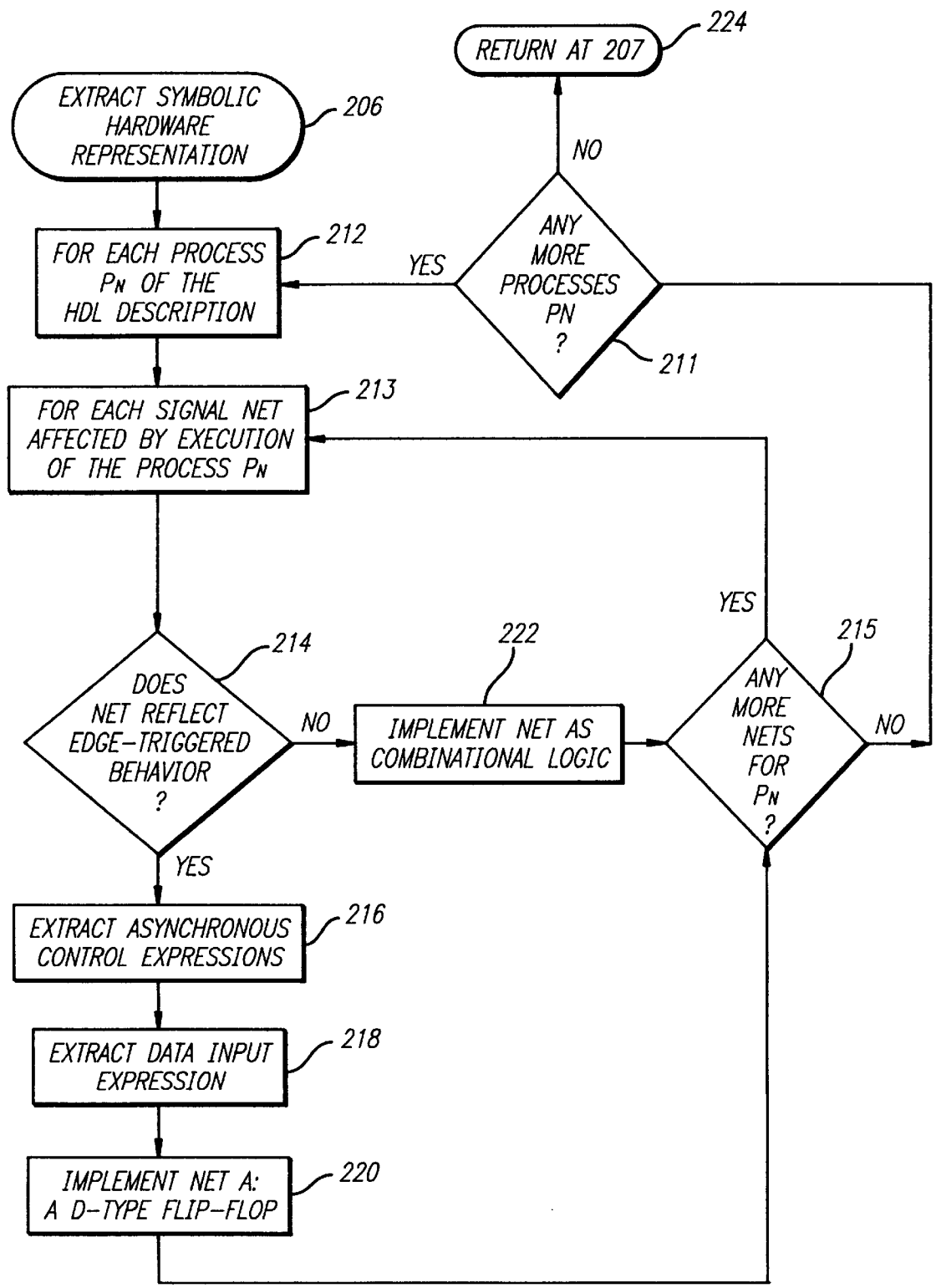
FIG. 1d is a process flow diagram describing the procedure for extracting the symbolic hardware representation of each process $P_N$.

A more detailed description of the routines represented by Test Block 214, Block 216 and Block 218 of FIG. 1d is now presented in conjunction with FIGS. 1e through 1g-2, as well as various example processes. During the Edge-sensitive Behavior Detection routine represented by Test Block 214 of FIG. 1d, the DAG representing the current net is examined to identify any 'EVENT operators (Block 230, FIG. 1e). If one or more 'EVENT operators are identified, the method determines whether there is more than one "distinct" 'EVENT operator at Test Block 231 (i.e. whether there is more than one distinct input to the current net which is conditioned on the occurrence of an 'EVENT). If there is only one distinct operator dependent on an 'EVENT (even if more than one 'EVENT can occur for the same input), operation returns to Block 216 of FIG. 1d.

The flow diagram of FIG. 1f provides more detail of the Extract Asynchronous Control Expression(s) routine represented by Block 216 of FIG. 1d. After calling this routine, processing continues at Block 240 where a new DAG is built representing the current net when there is no event. This is accomplished by building a new DAG wherein the 'EVENT operator is replaced with the constant FALSE (i.e. zero). Those of skill in the art will recognize that the identification of 'EVENT operators in DAGs can be easily accomplished using well-known search techniques, and that rebuilding the DAGs can be accomplished using well-known constant folding and optimization techniques. The resulting rebuilt DAG therefore represents the values of the current net as driven by asynchronous controls.

Processing continues at Block 242 of FIG. 1f as the separate expressions are determined for the generalized set and clear inputs to the flip-flop that will be used to emulate the behavior of the current net as defined by its DAG. The set and clear expressions are determined as follows:

If the value of the asynch. control expression is simply "NET-prev", both the setN and clearN expressions are inactive (i.e. they are not used to control the flip-flop and thus no setN or clearN input to the flip-flop is required). The value of NET-prev is simply the previous value of the net (i.e. output signal) prior to the execution of the current process $P_N$. The suffix "-prev" may be added to any process output variable to so indicate the value. Thus, for the only net of $P_1$, the output of the net is q and the previous value of the net is q-prev.

If the asynch. control expression is an "IF" expression, the setN expression is a new IF expression with the same condition as the asynch. control expression, with its TRUE and FALSE subexpressions being derived from the TRUE and FALSE subexpressions of the asynch. control expression. The clearN expression is formed in the same manner.

If the asynch. control expression is a "CASE" expression, the setN expression is a new CASE expression with the same selector input as the asynch. control expression, and the value for each choice is the setN expression produced for each choice of the asynch. control expression. The clearN expression is similarly produced by replacing the choices of the asynch. control expression with the clearN expressions produced for the CASE of the asynch. control expression.

Those of skill in the art will recognize that a CASE operator is one wherein the arc or flow path taken from the CASE node depends on a multiple bit control input, the value of which is decoded to select one of the possible paths to be taken. The CASE operator is much like a logic multiplexer wherein the value of a three-bit input (for example) is evaluated to determine one of eight possible paths. The CASE operator is treated the same as IF operators by the method of the invention except that CASE operators provide more than two paths.

Finally, for asynch. control expressions of any other type, the clearN expression is just the asynch. control expression and the setN expression is the complement of the asynch. control expression defined by the DAG being processed.

Figure 4A:
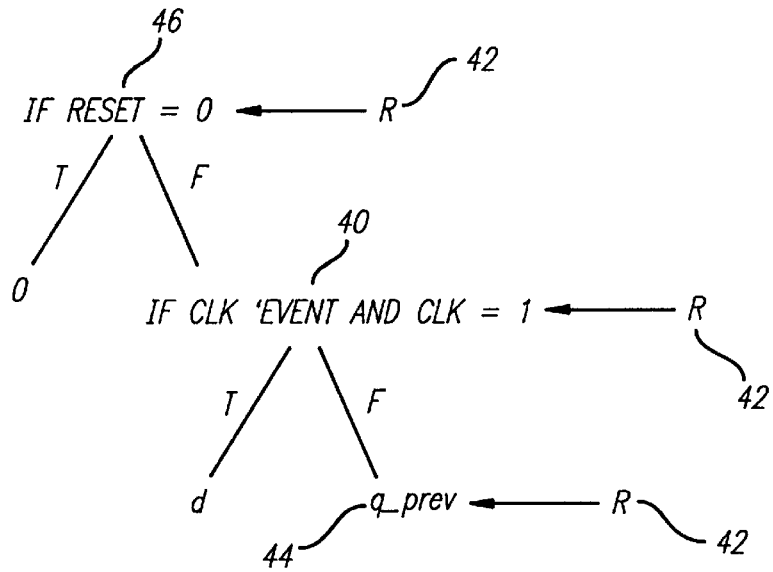
Figure 4B:
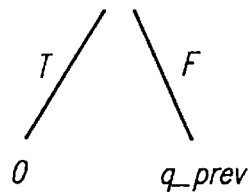
FIG. 4b illustrates the asynchronous control expression for processes $P_1$ and $P_2$ of FIGS. 2a and 2b.
Figure 4C:
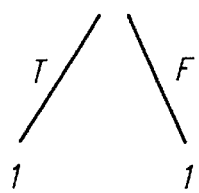
FIG. 4c illustrates the separated setN and clearN expressions for processes $P_1$ and $P_2$.
Figure 4C:
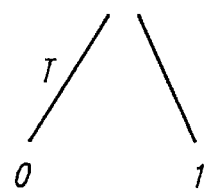

Applying the foregoing rules of the routine represented by Block 242 to the asynch. control expression DAG of FIG. 4b, the setN and clearN expressions are determined to be those shown in FIG. 4c. The setN and clearN inputs are assumed active low (i.e. binary zero). Thus, when the IF statement is TRUE, setN must be a one and when the IF statement is FALSE, the setN signal must also be a one. Thus, the setN signal is never active and is not used to control the flip-flop that will be used to emulate the only net of processes $P_1$ and $P_2$. The clearN signal must be an active zero when the IF statement is TRUE in order that the output q be a binary zero, and likewise must be an inactive one when the IF statement is FALSE so that the output signal q is left in its previous state (i.e. q-prev).

As will be shown later in another example, this generalized approach for determining the asynchronous control inputs of a flip-flop not only permits the determination to be HDL code independent (i.e. the method as applied to the net of $P_1$ and $P_2$ yields the same asynch. control expression even though they semantically describe the same behavior differently), but the invention also permits the synthesizer to infer the hardware encoding of setN and clearN inputs of flip-flops to implement asynchronous loading of flip-flops with particular values. Because flip-flops could be loaded with any number of combinations of values within a process, the use of specific templates to cover all of the possible combinations of values to be loaded would be prohibitive.

Processing continues at Block 218 of FIG. 1d where the method of the present invention calls the Extract Data Input Expression Routine to determine the expression governing the data input to the flip-flop which will implement the behavior of the current net of $P_N$. This expression is derived from the synchronous or clocked behavior of $P_N$. Processing continues at Block 250 whereby all "leaf" or bottom values of the expression DAG (generated at Block 204, FIG. 1c), having a value equal to the value of the net prior to the execution of $P_N$ (i.e. NET-prev), are marked to be retained. Processing advances to Block 252 where all IF operators with an 'EVENT as a condition are marked for retention. Then, from each 'NET-prev' leaf and from each IF with 'EVENT, all nodes which are an ancestor of the marked nodes (up to the root of the DAG) are also marked for retention.

At Block 258, a new DAG is then generated which retains all IF operators with an 'EVENT condition and all NET-prev leaves. Any other IF operators are retained if, but only if, the values for both the TRUE and FALSE sides of the IF operator are marked for retention or both are not marked for retention. If the value of one side is marked, but not the other, the IF operator is suppressed and only the side marked for retention is retained. This serves the function of trimming out IF operators that select a value of the output based on asynchronous control.

A CASE operator will likewise only be retained if all or none of its subexpression choices are marked for retention. If less than all choices are marked, the CASE operator is suppressed and only the path(s) marked for retention are maintained; any paths not marked for retention are replaced with NET-prev. Any other type of expression node is retained if any of its subexpressions are marked to be retained.

The resulting new DAG is an expression giving the value of the current net in cases where asynchronous controls are inactive. Processing continues at Block 260 where this new DAG is altered by replacing the 'EVENT condition of any IF operator with the constant TRUE. The DAG is then evaluated to determine the value of the net when clk=1 and when clk=0. This is accomplished by replacing the net's clock input signal with a binary one and then with a binary zero.

Processing continues at Block 262, where if it is determined that the new DAG evaluates to NET-prev when forcing clk equal to zero, then the flip-flop used to implement the current net should be configured to change state on the rising edge of the clock input signal of the net. The expression of the net produced by forcing clk equal to one then represents the data input (i.e. D) to the flip-flop. The opposite is true if the new DAG evaluates to NET-prev when clk is forced equal to one (Block 262, FIG. 1g-2).

Applying the foregoing processing steps to the DAG of FIG. 4a, IF operator 40 is marked for retention, leaf 44 having a value of q-prev is marked for retention, and all ancestor nodes of leaf 44 and IF operator 40, up to and including the root 46, are marked for retention. Marks 42 are indicated to represent the marking process for purposes of illustration.

Figure 4D:
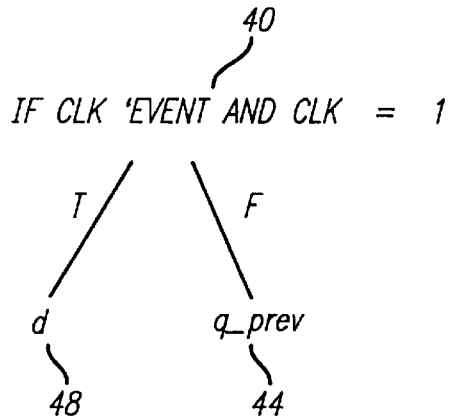
FIG. 4d illustrates the input expression for the processes $P_1$ and $P_2$.

New DAG of FIG. 4d is built, retaining IF operator 4C and its subexpressions. IF operator 46 is suppressed because the TRUE side value was not marked for retention. The new DAG of FIG. 4d represents the clocked response of the current net when asynchronous controls are inactive. With 'EVENT assumed to be TRUE, if clk equals a binary one, q will equal d, and if clk equals a binary zero, q will equal q-prev. Thus, the flip-flop is clocked with the rising edge of the current's clocked input clk and the extracted input expression for the flip-flop input D is d.

It should be noted that this identical result is derived from both $P_1$ and $P_2$ of FIGS. 2a and 2b, regardless of the fact that they are written differently in HDL. This is because the method of the present invention derives the same asynch. expression DAG and input expression DAG for the behavior defined for a net independent of the semantics used in the behavioral description of the process affecting the net.

Figure 4E:
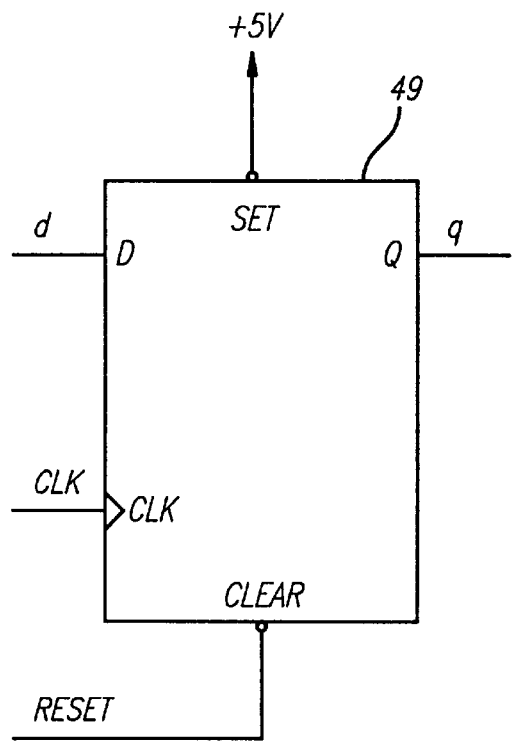
FIG. 4e illustrates a symbolic hardware flip-flop implementation of the behavior of processes $P_1$ and $P_2$.

FIG. 4e illustrates the symbolic hardware implementation of the processes $P_1$ and $P_2$ as derived at Block 220 of FIG. 1d from the setN and clearN expressions and the data input expression. Flip-flop 49 can be implemented using a standard D-type flip-flop cell with an active low clear input (i.e. clearN) and which is triggered on the positive edge of the net's clocked input signal clk. The setN input of the generalized flip-flop is tied high to indicate that it's not used.

Once the symbolic hardware implementation for the behavior of the net has been extracted, well-known optimization techniques can be used to optimize that hardware implementation (e.g. at Block 208, FIG. 1c). For example, a flip-flop can be selected that does not have a set function.

FIG. 6a illustrates a process $P_4$, which involves the asynchronous loading of data into a register. Because the method of the invention permits the inference of generalized setN and clearN expressions, hardware to emulate such behavior is easily synthesized. To apply the prior art solution of templates would require a prohibitive number of templates to recognize the many ways in which this behavior could be described by a user; there are a vast number of expressions which could control the asynchronous inputs depending upon the data value to be loaded and the number of flip-flops to be loaded during the process.

FIG. 6b shows the expression graph or DAG representing the only net of $P_4$ generated by known symbolic simulation techniques from the CFG of $P_4$. Applying the method of the invention, the DAG is first identified as implementable with a flip-flop by the existence of IF operator with an 'EVENT 60. The asynch. control expression is then derived by replacing the 'EVENT operator with FALSE. The resulting new DAG is illustrated in FIG. 6c. The separated setN and clearN expressions are then generated and are illustrated in FIG. 6d. Those of skill in the art will recognize that the routine for performing this separation (represented by Block 242, FIG. 1f) can be implemented with a recursive algorithm (with or without a cache) or an iterative algorithm, starting by sorting all of the subexpressions into topological order.

The data input expression is then derived from the DAG of FIG. 6b by marking IF operator 60 for retention, marking for retention leaf 62 which has a value of q-prev, and then marking all ancestor nodes of leaf 62 and of IF operator 60 up to the root. The resulting data input expression is illustrated in FIG. 6e, wherein only the IF operator with 'EVENT 60 is retained (along with its two subexpressions, including retained leaf 62).

The data expression is determined by substituting TRUE for 'EVENT and then evaluating the current net when clk is a binary one and when clk is a binary zero. From this process, the input expression is determined to be d and the flip-flop is sensitive to the rising edge of the current net's clocked input signal clk. FIG. 6f illustrates the symbolic hardware implementation of the process, including the logic used to drive the setN and clearN inputs of the "D" type flip-flop, as well as the D input and clk input signals.

Figures 5, 7A, 7B:
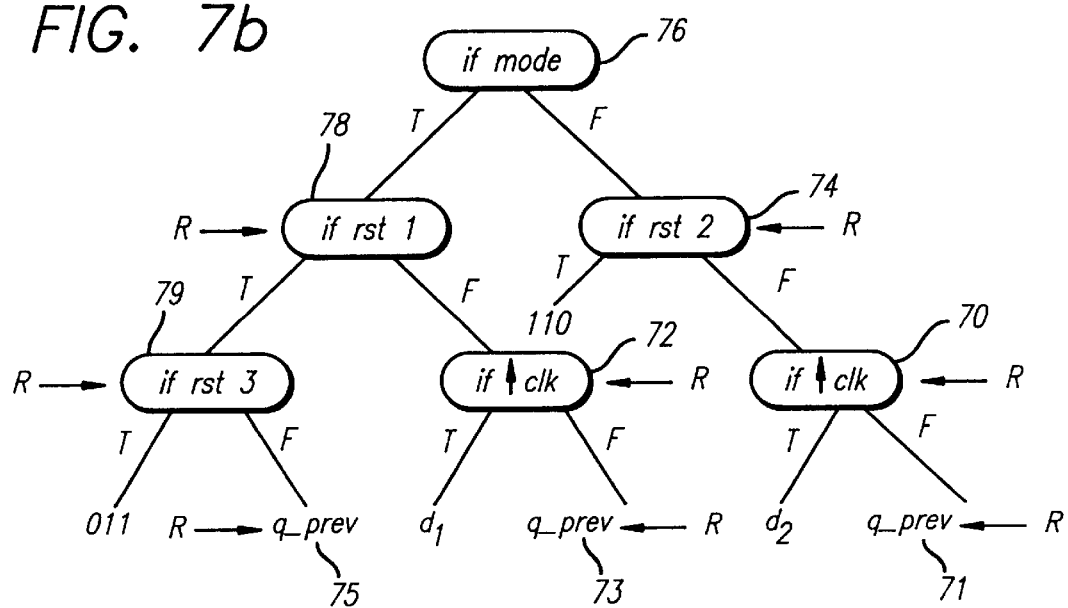
FIG. 5 is an HDL description of a process which involves the same edge-sensitive behavior of process $P_1$ but which would not be so recognized by a template designed to identify the behavior of $P_1$.
FIG. 7a is an HDL description of a process $P_5$ that involves two ticks of the same clock input.
FIG. 7b illustrates the expression DAG representing the only net of process $P_5$.

FIG. 7a illustrates a process $P_5$ that is sensitive to more than one tick of its clocked input. This example serves to illustrate still further the general nature of the method of the invention. Processes can involve any number of clock ticks on the same input signal. Thus, not only would the prior art solution require an exhaustive number of templates for a process having just one tick, but in order not to place still further undesirable constraints on users, there would have to be such a set of templates for every number of ticks of the clock that might be permitted to be specified in the behavioral description of a process.

The expression graph or DAG for the only net (i.e. q) for process $P_5$ is illustrated in FIG. 7b. Again, this DAG is generated from the HDL representation of the process (FIG. 7a) using known techniques of symbolic simulation. Because two IF operators with 'EVENTs 70, 72 for the same input signal are contained in the DAG, the current net is identified as having an 'EVENT by Block 232. Because it is only one "distinct" 'EVENT operator (i.e. clk), processing returns to Block 216 of FIG. 1d through Block 231 of FIG. 1e. Note that IF operators 70 and 72 are shown using a short-hand notation which equates to "IF clk 'EVENT and clk=1." Also note that the q output (i.e. the only net) of the process $P_5$ is three bits, which suggests three flip-flops combined in parallel to produce the three-bit output. The net is called a concatenate because the output effected by the execution of $P_5$ is a concatenation of three bits. Concatenation is often used to represent multiple-bit outputs such as buses.

Figure 7C:
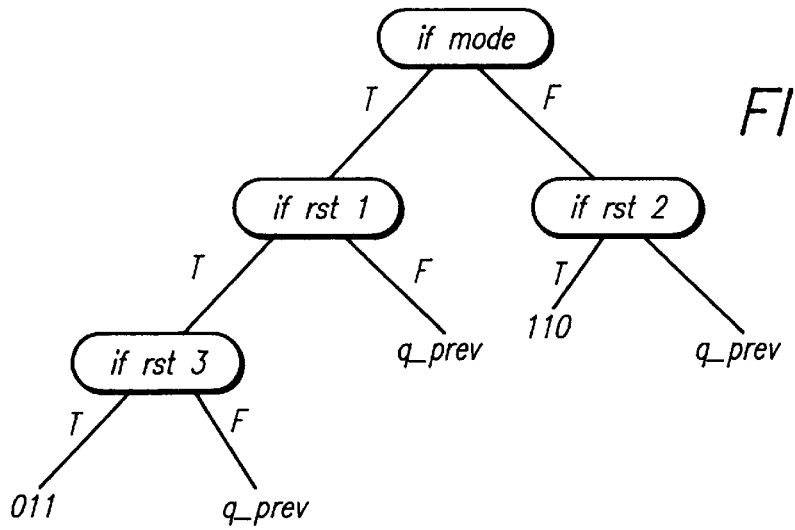
FIG. 7c illustrates the asynchronous expression for $P_5$.
Figure 7D:
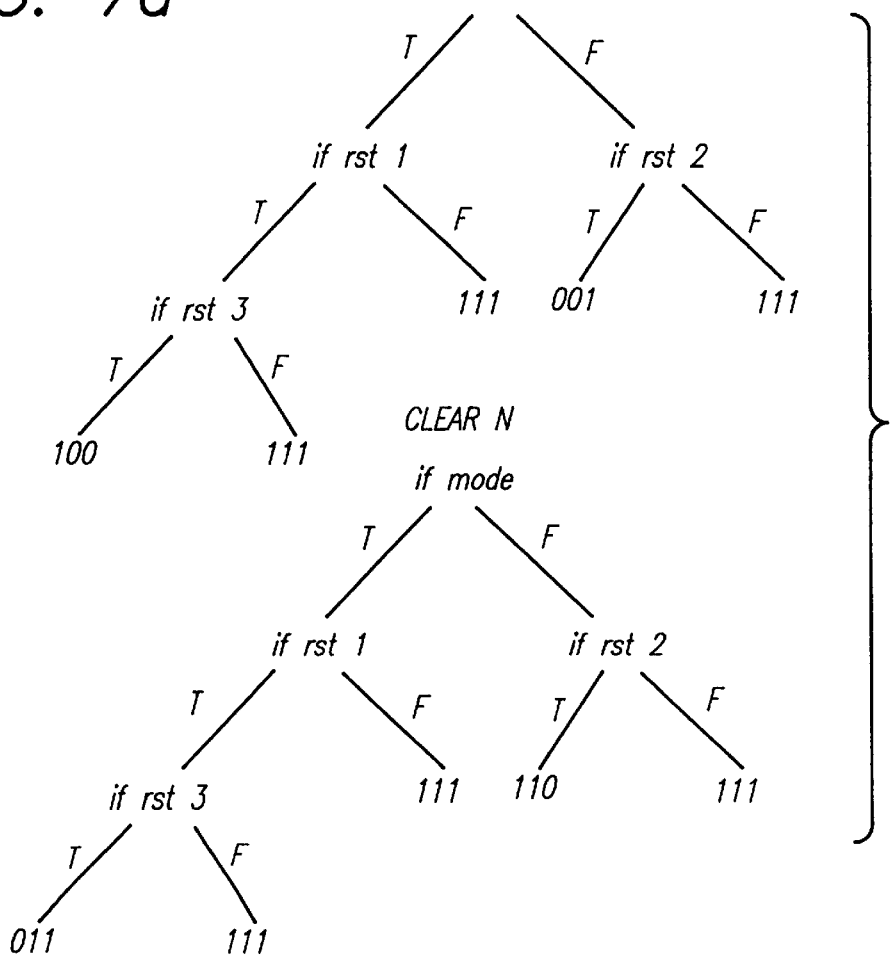
FIG. 7d illustrates the separated setN and clearN expressions for $P_5$.

The asynch. control expression derived from the DAG of FIG. 7b is illustrated in FIG. 7c. Once again, the new DAG is derived by setting the 'EVENT operators of nodes 70 and 72 of FIG. 7b to FALSE. The separate setN and clearN expressions are derived from the new DAG of FIG. 7b in accordance with the method of the invention as previously described.

Finally, the data input expression is derived from the DAG of FIG. 7b by marking for retention the two IF operators with 'EVENT (nodes 70 and 72), marking for retention the leaves 71, 73 and 75 having values of q-prev, and marking the ancestor nodes of leaf 71 (i.e. nodes 70, 74, 76), of leaf 73 (i.e. nodes 72, 78, and 76) of leaf 75 (i.e. nodes 79, 78 and 76) and of IF nodes 70 and 72. IF nodes 70 and 72 are retained because they have 'EVENT operators. IF node 76 is retained because both of its sides are marked to be retained. IF node 78 is retained because both of its sides are marked for retention. IF nodes 74 and 79 are suppressed because each had a side not marked for retention. Thus, they became pass-throughs to retained node 70 and retained leaf 75 respectively. The new DAG is shown in FIG. 7e.

The data input expression for the current net is derived from the DAG of FIG. 7e by substituting TRUE into the two 'EVENT operators and then forcing the clk input to a one, and then to a zero. When clk is a zero, the output is q-prev regardless of the other signals of the net. Thus, the data input expression is defined by the DAG when clk is a binary one, and the flip-flop used to implement the net will be clocked by the rising edge of the net's clocked input signal clk. FIG. 7f shows the two evaluations.

Figure 7G:
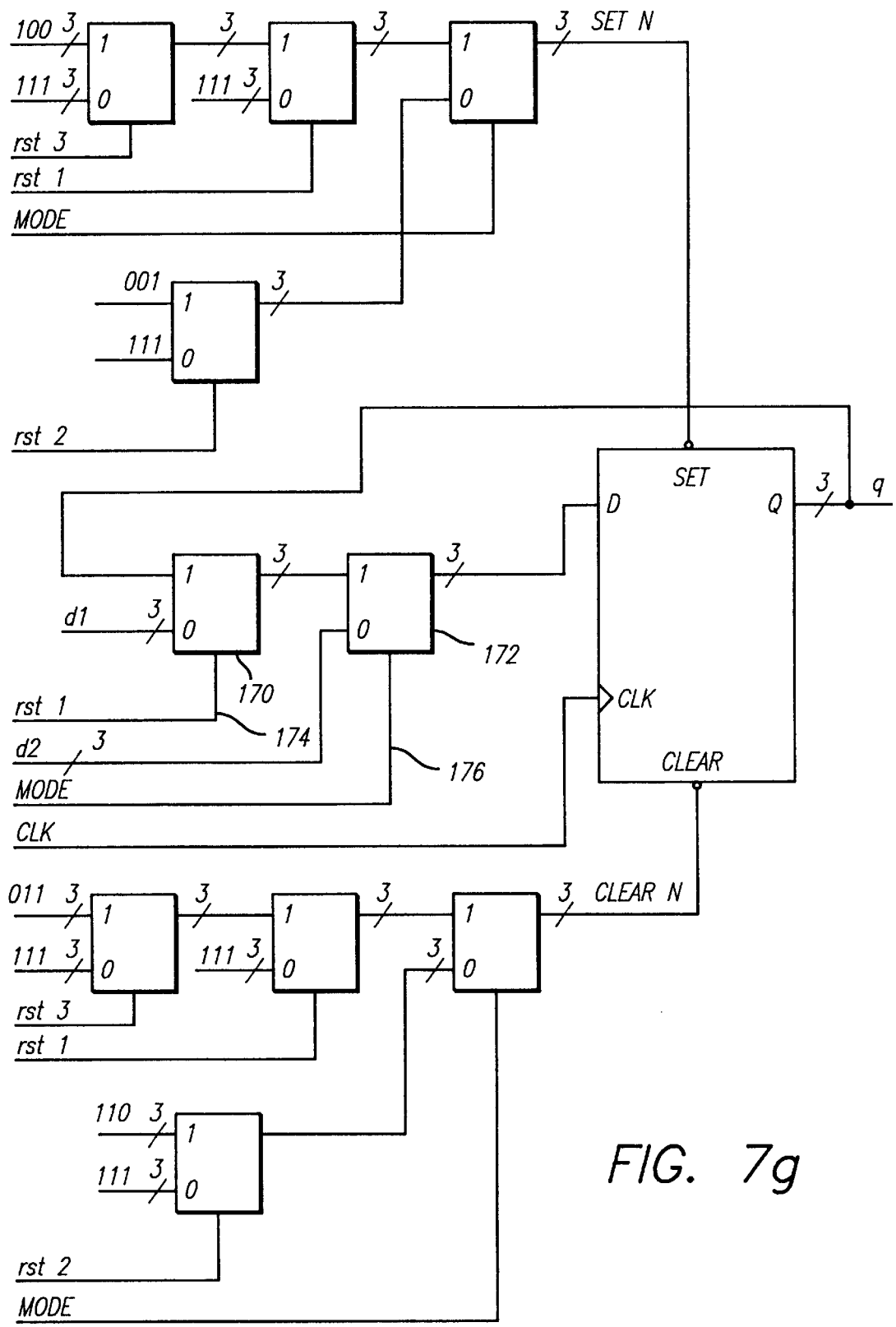
FIG. 7g is a symbolic hardware representation of the edge-sensitive behavior described by $P_5$.

FIG. 7g illustrates the symbolic hardware implementation of this process as generated by the routine represented by Block 220. Note that there would typically be three flip-flops specified by Block 220 to produce the three-bit output q. (For simplicity, the implementation is shown as a single cell for which the D, setN and clearN inputs are three-bit buses and the Q output is also a three-bit bus.) The data input logic is the same for all three flip-flops except that each flip-flop would be coupled to a different bit of three-bit input buses d1 and d2. Multiplexers 170 and 172 illustrate which input buses (i.e. d1 and d2) pass to their respective outputs depending upon the logic level of their control inputs (i.e. rstl 174 and mode 176 respectively).

Note that the logic for the setN and clearN expressions will be different for each flip-flop generating a different bit of the three-bit output bus q. This difference is reflected in the combined representation shown in FIG. 7g. Also note that the logic implementation of the control inputs are illustrated here using multiplexers producing three-bit buses to implement the setN and clearN expressions. Well-known logic optimization techniques would typically be used, however, to simplify the logic circuitry of FIG. 7g considerably. Such optimization techniques could be applied to the symbolic implementations at, for example, Block 208 of FIG. 1c. The details of such logic optimization techniques are not, however, pertinent to the present invention.

The following are some special cases for which the method of the invention has been refined in order to handle an even broader range of behavioral descriptions that may be presented to it.

The method of the invention will recognize cases where the current net is edge-sensitive but the edge-sensitive behavior is not explicitly specified by the user using an IF operator with an 'EVENT condition. The user could describe edge-sensitive behavior implicitly in an HDL description where a net affected by a process is sensitive to only a one-bit signal and the value of the output (i.e. target) is changed for only one value of the one-bit input signal. Such a description implicitly indicates an edge-sensitive behavior implementable by a flip-flop.

The present invention recognizes this situation when it is processing the DAG representing the current net to determine whether it contains an 'EVENT. Thus, even though no 'EVENT operator is found, further processing is triggered at Block 234 of FIG. 1e when the invention determines that despite the lack of an 'EVENT, the process is sensitive to only one bit. The method then treats the signal to which the process is sensitive as the clock by adding to the expression DAG an 'EVENT operator at Block 239. Processing then returns to Block 216 of FIG. 1d. An example of such a process $P_6$ is illustrated in FIG. 8a.

If the description of the process is that shown in FIG. 8b for process $P_7$, however, the above treatment is not appropriate because one of the values for clk will not produce an output of q-prev.

Figure 1E:
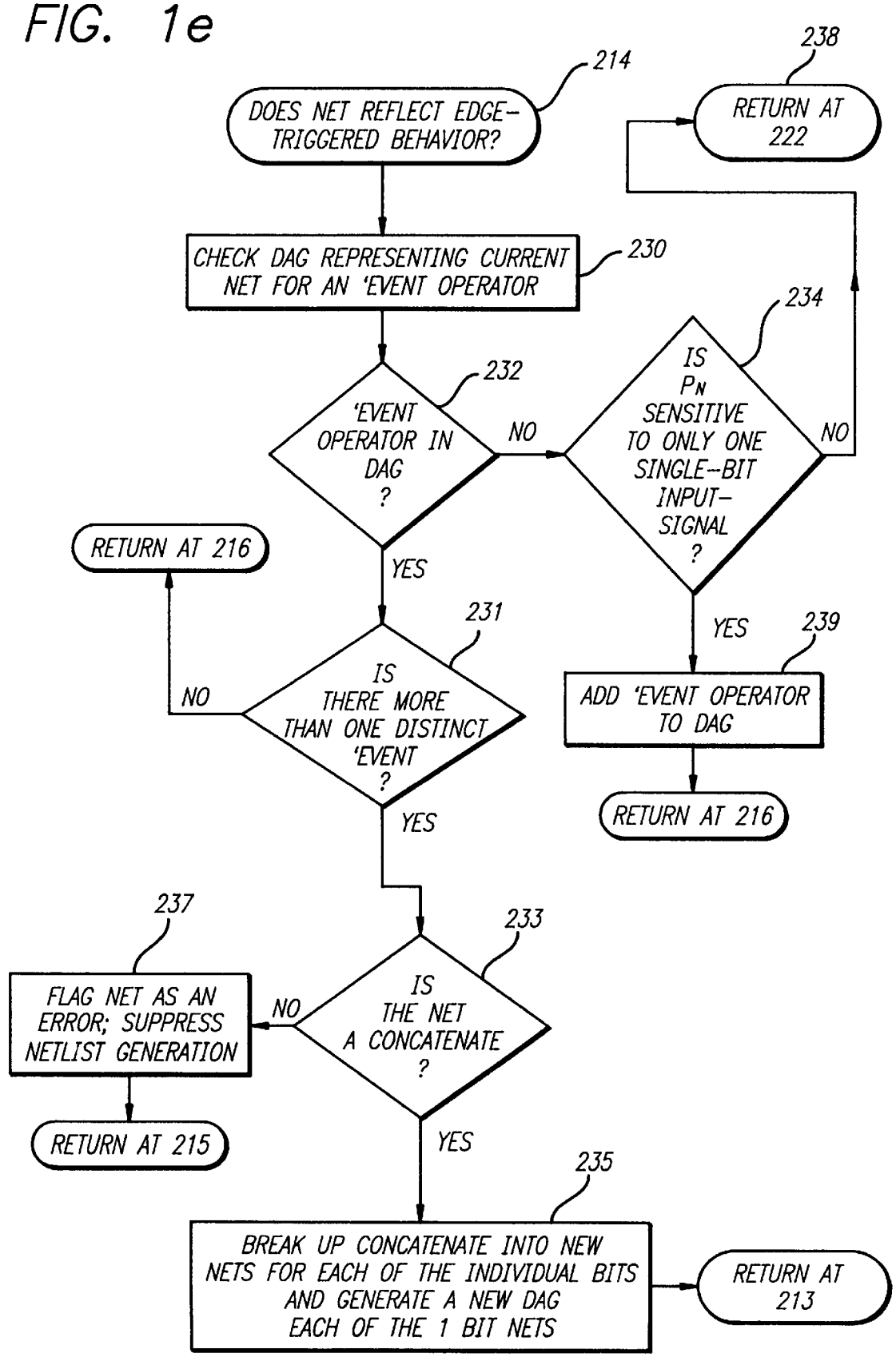
FIG. 1e is a process flow diagram describing the procedure for identifying edge-sensitive behavior in the current net of each process $P_N$.
Figures 1, 1G:
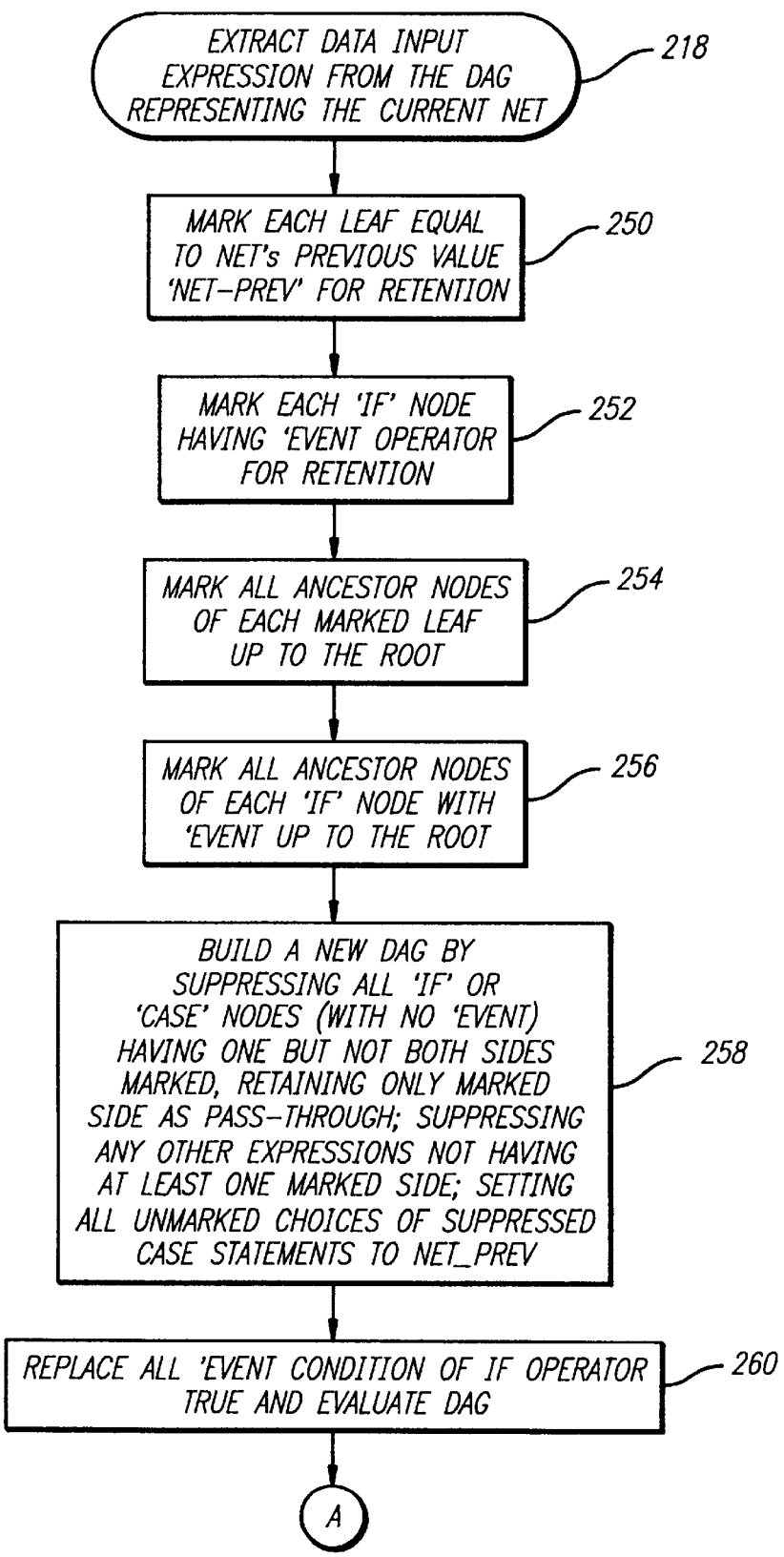
FIG. 1g-1 is a process flow diagram describing the procedure for extracting input expressions from a DAG representing the current net.
Figures 1, 1G, 2:
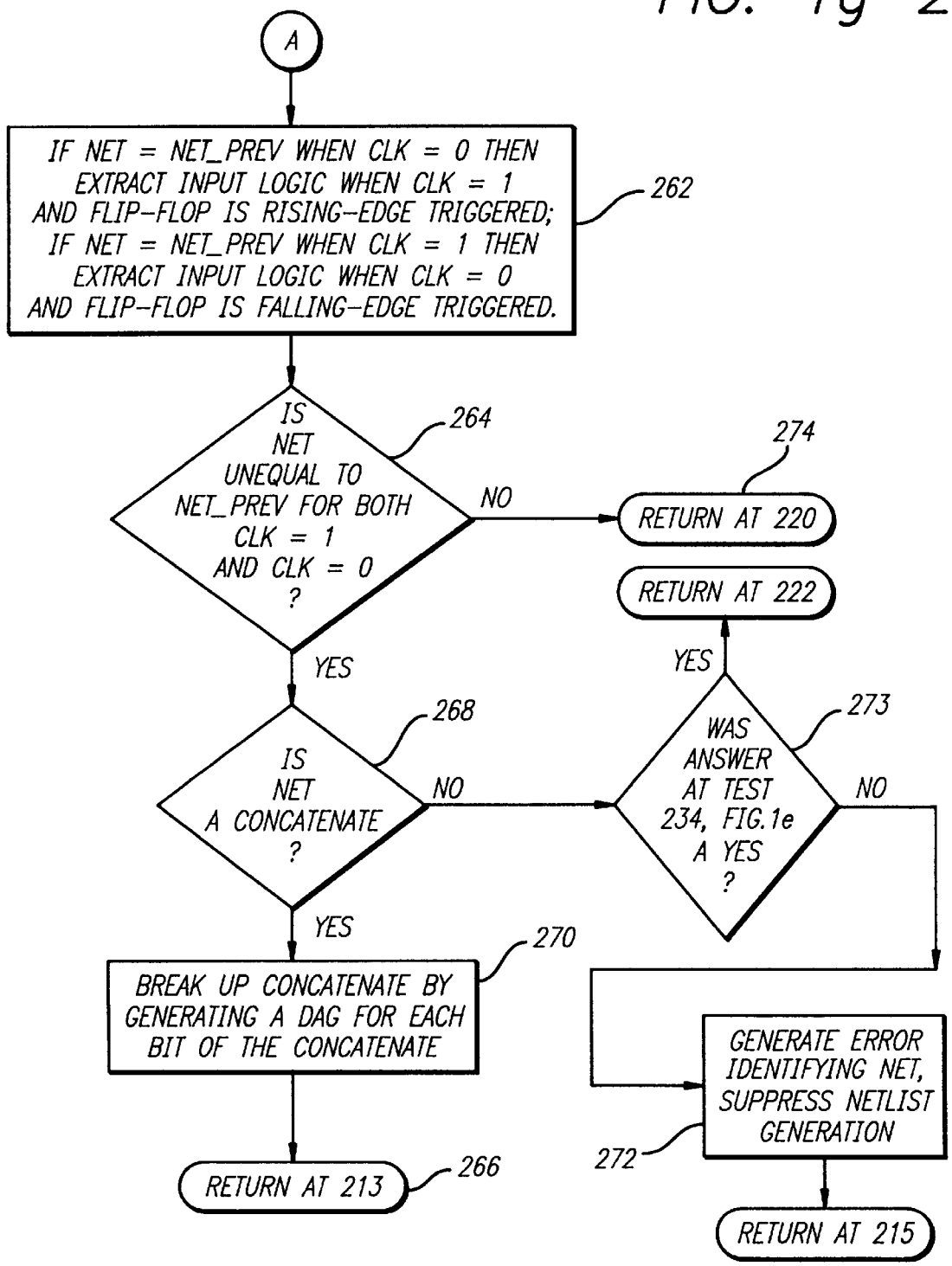

Thus, when processing of the net for $P_7$ reaches Block 264 of FIG. 1g-2, this result is detected. Block 268 then recognizes that the current net is not a concatenate (i.e. it is a one-bit output signal), and passes control to Block 273. Block 273 recognizes that this current net had been processed through the YES path of Block 234 of FIG. 1e and returns processing to Block 222. The behavior of this net is then implemented as combinational logic rather than an edge-triggered flip-flop. Were this net not processed through the YES path of Block 234, an error condition would be noted for this net and netlist generation would be suppressed by Block 272. The process then returns to Block 215.

As previously illustrated, nets are sometimes a concatenation of bits where the target represents a bus for example. When such a net is sensitive to only one edge of a single input 'EVENT operator, processing occurs as described for the net of example process $P_5$ described above. There are three special cases involving concatenated nets that the method of the invention handles by breaking the concatenate up into individual single-bit nets for each bit of the concatenate. Processing then proceeds on each individual net as previously described.

One such case is illustrated in FIG. 9a, where a concatenated net of process $P_8$ is sensitive to more than one distinct input clock signal with 'EVENT operator (i.e. clocked input signals clk1 and clk2), and each one clocks a different portion of the concatenated net. The output "dbus" has eight bits, and bits seven through four are driven by the first clock, clk1, and bits three through zero are driven by the second distinct 'EVENT operator clk2. The expression DAG for the only net of $P_8$ (concatenate dbus) is shown in FIG. 9c.

Figures 9E, 10A, 10B:
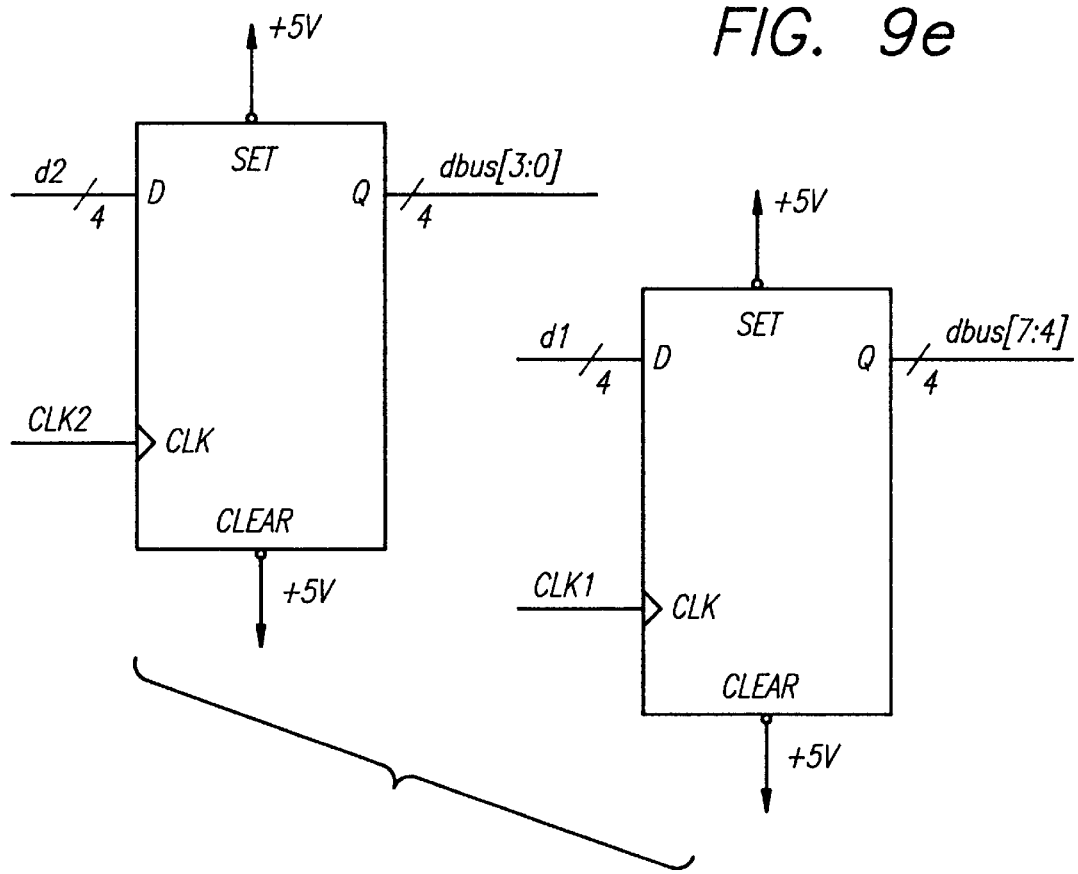
FIG. 9e illustrates a symbolic hardware implementation of $P_8$.
FIG. 10a is an HDL description of a process $P_9$ which involves a concatenation of output bits as a bus, a portion of the bits comprising the bus being sensitive to the positive edge of a clock, and another portion of the bits comprising the bus being sensitive to the negative edge of the clock.
FIG. 10b is an HDL description of a process $P_{10}$ which is behaviorally identical to the process $P_9$ of FIG. 10a except that its edge-sensitive behavior is implicit.

The method first detects the existence of the 'EVENT operators at Block 232 of FIG. 1e. The method then determines at Block 231 that there are two distinct 'EVENT operators affecting the current net. Block 233 determines that the current net is a concatenate. Processing proceeds to Block 235 where the concatenate is broken up into single-bit nets for each bit of the concatenate and new DAGs are generated representing each single-bit net. Examples of such single-bit expression graphs for dbus7 and dbus0 are shown in FIG. 9d. The method then returns to Block 213 of FIG. 1d, and continues processing each single-bit net of the concatenate individually as previously described. Ultimately, the invention implements the concatenated net of $P_8$ in symbolic hardware as eight separate flip-flops, one for each bit of the concatenate. Each flip-flop has an input expression dictated by its single-bit expression graph. Note that each of the eight flip-flops could also have distinct setN and clearN expressions as well if the behavior of the net had so dictated. FIG. 9e illustrates a hardware implementation of the concatenated net of $P_8$ which combines bits of the output dbus for ease of illustration.

Figure 10C:
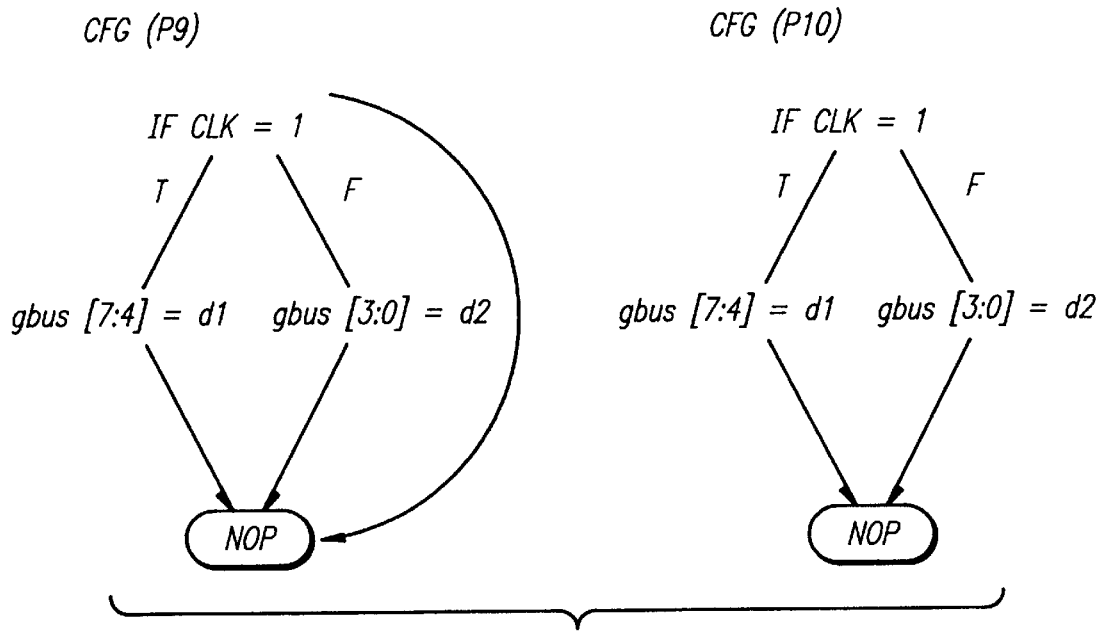
FIG. 10c illustrates the CFGs for processes $P_9$ and $P_{10}$ respectively.
Figure 10D:
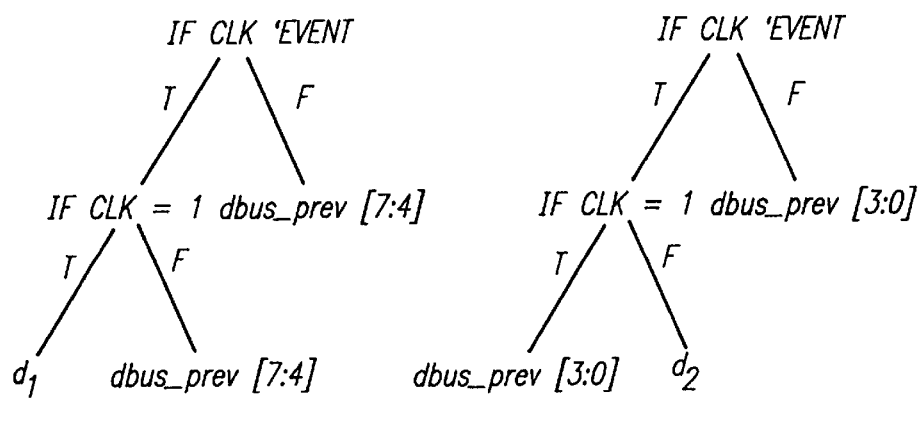
FIG. 10d illustrates the expression DAGs representing the only net in processes $P_9$ and $P_{10}$ respectively.

The other two special cases are illustrated by the processes described in FIGS. 10a and 10b. In FIG. 10a, a process $P_9$ is illustrated where there is a single 'EVENT but half of the bits of dbus are clocked by the positive edge of the clocked input clk, and half by the negative edge. The method recognizes at Block 214 (FIG. 1d) the existence of an 'EVENT operator in the DAG representing the only net of $P_9$. The DAG is shown in FIG. 10d.

Process $P_{10}$ of FIG. 10b illustrates the same behavior as $P_9$, but the edge-triggered behavior of $P_{10}$ is implicitly described just as it was for the example process P (FIG. 8a). For the net of $P_{10}$, the routine at Block 234 recognizes that the process $P_{10}$ is sensitive to only one single-bit input (i.e. clk). This is determined from the "support" of the process (i.e. the list of inputs to which execution of the process is sensitive). Block 239 then adds an "EVENT operator in conjunction with the single-bit input clk to signify that it is a clocked input signal.

The addition of the 'EVENT operator renders the DAG for the only net of $P_{10}$ the same as the DAG for the only net of $P_9$. This DAG is illustrated in FIG. 10d. From there, processing is identical for both nets and continues to Block 264 where it is determined that neither net yields a result of dbus-prev for clk=1 or clk=0. Thus, it is impossible to discern with which edge of the net's clocked input to clock a flip-flop to implement the net. Processing continues at Block 268 which recognizes for either process that the net is a concatenate and breaks up the current net into single-bit nets and generates a new DAG representing each new single-bit net. Processing then resumes at Block 213 of FIG. 2d, with each of the single-bit nets now added to the total number of nets affected by the current process.

Figure 10E:
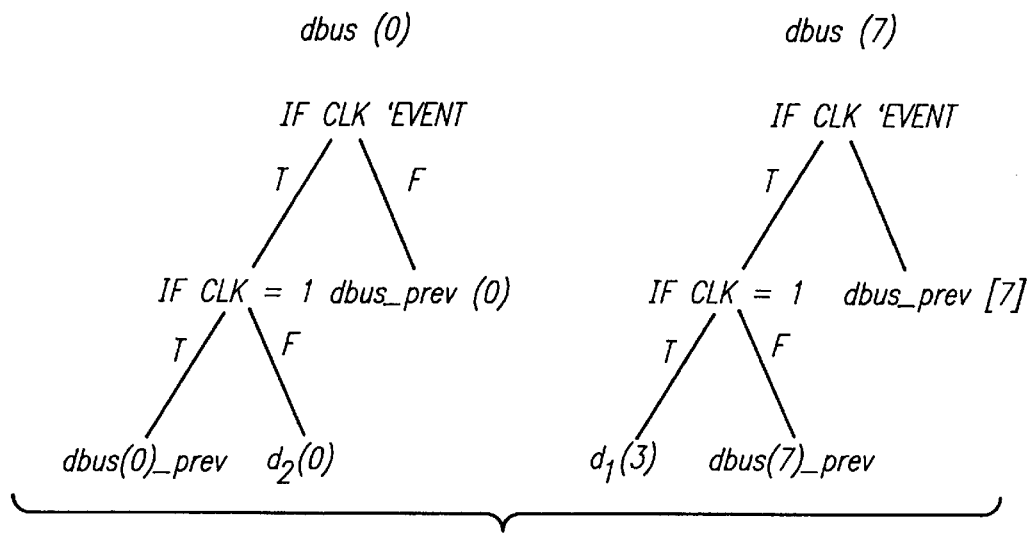
FIG. 10e illustrates the single-bit DAGs for the least significant bit of the bus output and the most significant bit of the bus output respectively.
Figure 10F:
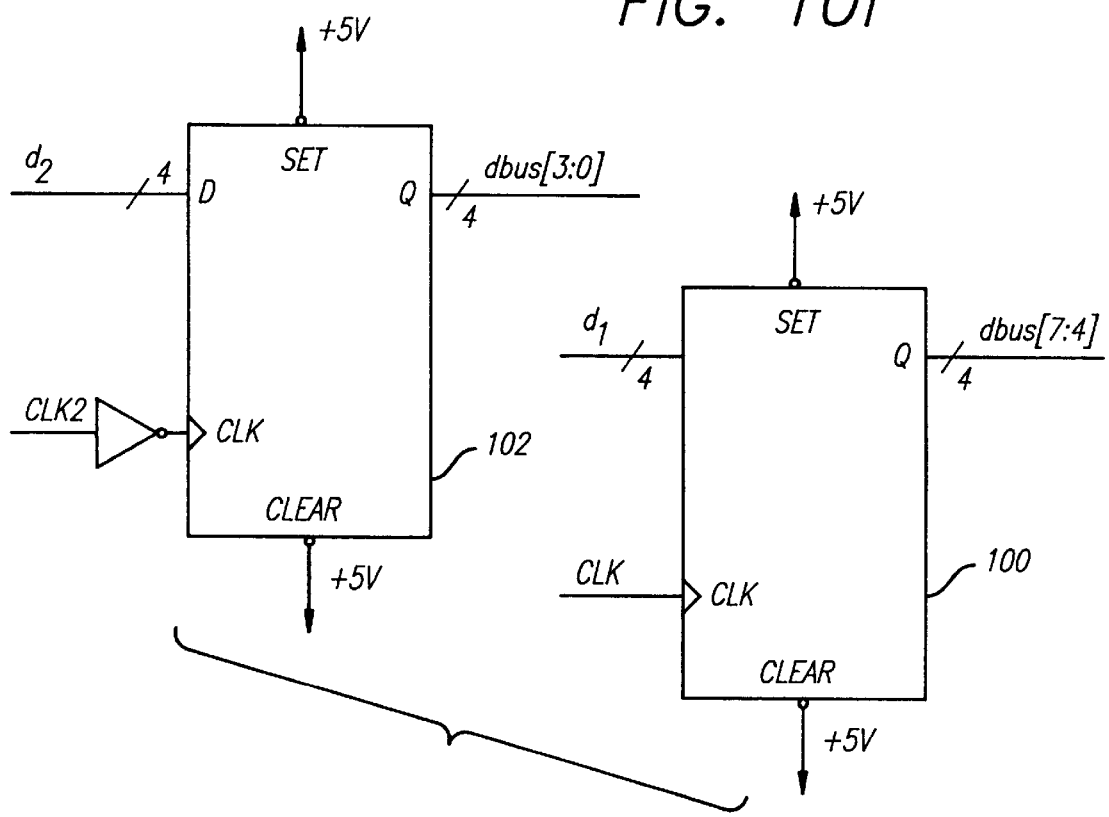
FIG. 10f illustrates a hardware implementation of the edge-sensitive behavior for $P_9$ and $P_{10}$.

FIG. 10e illustrates two of the eight new DAGs, one for dbus0 and one for dbus7. Thus, the method once again implements the behavior of the concatenated net as eight individual D-type flip-flops, one for each bit of the output dbus. A more compact representation of the hardware implementation for $P_9$ and $P_{10}$ is shown in FIG. 1f for convenience. The compound flip-flops 100 and 102 each represent four, single-bit flip-flops.

Note that compound flip-flop 100 is clocked by the rising edge of the net's clocked input signal clk, and compound flip-flop 102 is clocked by the falling edge of the net's clocked input clk. Note also that both the setN and clearN inputs of the generalized flip-flops are tied to 5 volts to indicate that they are not used. Of course, during optimization flip-flop cells can be chosen for these nets that do not have set and clear functions.

It should be noted that if the process $P_{10}$ was also sensitive to the values of variables d1 and d2, the behavior would be that of level sensitive latches rather than edge-sensitive behavior. The method of the invention recognizes such sensitivity at Block 234 because d1 and d2 would be included in the support of the process. Thus, the invention would implement this latched behavior as combinational logic (Block 222, FIG. 1*d*).

Those of skill in the art will recognize that there are many well-known techniques for implementing the routines of the method of the present invention using a general purpose digital computer. For example, it is well known in the compiler and expression management arts how to build and manipulate expression graphs. Thus, those of ordinary skill will be able to write the software code necessary to implement the method as disclosed herein.

What is claimed is:

1. A method for detecting edge-sensitive behavior from a functional description of a circuit and inferring a hardware implementation of the detected edge-sensitive behavior, the functional description comprising one or more processes, execution of each of the one or more processes affecting one or more nets, each of the one or more nets represented by a directed acyclic graph (DAG), said method comprising the steps of:

for each of the one or more nets affected by each of the one or more processes:

using the DAG representing a current one of the one or more nets affected by a current one of the one or more processes, determining whether the behavior of the current net is edge-sensitive; and when the behavior of the current net is determined to be edge-sensitive by said determining step:

extracting an asynchronous control expression from the DAG representing the current net by rebuilding the DAG representing the current net either to remove operators that select a value for the current net based on asynchronous control, or with all event operators set equal to false;

extracting a data input expression from the DAG representing the current net; and implementing the current net as a flip-flop using the extracted asynchronous control expression and the extracted data input expression.

2. A method for detecting clock edge-sensitive behavior from a functional description of a circuit and inferring a hardware implementation of the detected clock edge-sensitive behavior, the functional description comprising one or more processes, execution of each of the one or more processes affecting one or more nets, each of the one or more nets represented by a directed acyclic graph (DAG), said method comprising the steps of:

for each of the one or more nets affected by each of the one or more processes;

using the DAG representing a current one of the one or more nets affected by a current one of the one or more processes, determining whether the behavior of the current net is clock edge-sensitive; and when the behavior of the current net is determined to be clock edge-sensitive by said determining step:

extracting an asynchronous control expression from the DAG representing the current net;

extracting a data input expression from the DAG representing the current net; and implementing the current net as a flip-flop using the extracted asynchronous control expression and the extracted data input expression, wherein said step of extracting an asynchronous control expression further comprises the step of:

rebuilding the DAG representing the current net with all event operators set equal to false.

3. The method of claim 2 further comprising the step of implementing the current net as combinational logic when the behavior of the current net is determined to be not edge-sensitive by said determining step.

4. The method of claim 2 wherein the flip-flop implementation of the current net is an edge-triggered D-type flip-flop with asynchronous set and clear inputs.

5. The method of claim 2 wherein said determining step further comprises the step of detecting edge-sensitive behavior when the DAG representing the current net contains at least one distinct event operator.

6. The method of claim 5 wherein said determining step further comprises the step of breaking up the current net into single-bit nets when the current net is a concatenate and the current net is sensitive to more than one distinct event operator.

7. The method of claim 6 wherein said determining step further comprises the steps of:

building DAGS representing each of the single-bit nets; and including the single-bit nets in the one or more nets affected by the current process.

8. The method of claim 2 wherein said determining step further comprises the step of detecting edge-sensitive behavior which is implicitly specified when the current process affecting the current net is sensitive to only one single-bit input signal.

9. The method of claim 8 wherein said determining step further comprises the step of adding an event operator to the DAG representing the current net detected as having implicitly specified clock-edge-sensitive behavior.

10. The method of claim 9 wherein said step of extracting an asynchronous control expression further comprises the step of determining separate set and clear expressions from the rebuilt DAG.

11. The method of claim 10 wherein said step of extracting an asynchronous control expression further comprises the step of evaluating the set and clear expressions for each leaf of the rebuilt DAG to extract logical expressions defining set and clear inputs to a flip-flop.

12. A method for detecting clock edge-sensitive behavior from a functional description of a circuit and inferring a hardware implementation of the detected clock edge-sensitive behavior, the functional description comprising one or more processes, execution of each of the one or more processes affecting one or more nets, each of the one or more nets represented by a directed acyclic graph (DAG), said method comprising the steps of:

for each of the one or more nets affected by each of the one or more processes:

using the DAG representing a current one of the one or more nets affected by a current one of the one or more processes, determining whether the behavior of the current net is clock edge-sensitive; and when the behavior of the current net is determined to be clock edge-sensitive by said determining step;

extracting an asynchronous control expression from the DAG representing the current net;

extracting a data input expression from the DAG representing the current net; and implementing the current net as a flip-flop using the extracted asynchronous control expression and the extracted data input expression, wherein said step of extracting a data input expression further comprises the step of:

rebuilding the DAG representing the current net to remove operators that select a value for the current net based on asynchronous control.

13. The method of claim 12 wherein said step of rebuilding the DAG representing the current net further comprises the step of setting all event conditions equal to true.

14. The method of claim 13 wherein said step of extracting a data input expression further comprises the steps of:

evaluating the rebuilt DAG to determine the value of the current net clocked input equals zero; and evaluating the rebuilt DAG to determine the value of the current net when the current net's clocked input equals one.

15. The method of claim 14 wherein said step of extracting a data input expression further comprises the step of defining the data input expression as that value of the current net which does not equal a value of the current net prior to execution of the current process.

16. The method of claim 15 wherein the flip-flop for implementing the current net is clocked with the rising edge of the current net's clocked input when the data input expression is derived from the rebuilt DAG with the current net's clocked input equal to one; and wherein the flip-flop implementing the current net is clocked with the falling edge of the current net's clocked input when the data input expression is derived from the rebuilt DAG with the current net's clocked input equal to zero.

17. The method of claim 14 wherein said step of extracting a data input expression further comprises the step of breaking up the current net into single-bit nets when the current net is a concatenate and when the current net does not equal the current net's value just prior to execution of the current process when the current net's clocked input is set equal to either one or zero.

18. The method of claim 17 wherein said step of extracting a data input expression further comprises the steps of:

building DAGS representing each of the single-bit nets; and including the single-bit nets in the one or more nets affected by the current process.

19. The method of claim 14 further comprising the step of implementing the net as combinational logic when the current net does not equal the current net's value just prior to execution of the current process and the current net is not a concatenate.

* * * * *